United States Patent
Lee

(10) Patent No.: US 9,041,013 B2
(45) Date of Patent: *May 26, 2015

(54) LIGHT EMITTING DEVICE AND LIGHING SYSTEM HAVING THE SAME

(71) Applicant: LG INNOTEK Co., Ltd., Seoul (KR)

(72) Inventor: Gun Kyo Lee, Seoul (KR)

(73) Assignee: LG INNOTEK., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/969,296

(22) Filed: Aug. 16, 2013

(65) Prior Publication Data

US 2013/0328094 A1 Dec. 12, 2013

Related U.S. Application Data

(63) Continuation of application No. 13/206,229, filed on Aug. 9, 2011, now Pat. No. 8,519,426.

(30) Foreign Application Priority Data

Aug. 9, 2010 (KR) .......... 10-2010-0076422
Aug. 9, 2010 (KR) .......... 10-2010-0076423
Aug. 9, 2010 (KR) .......... 10-2010-0076425
Aug. 9, 2010 (KR) .......... 10-2010-0076462

(51) Int. Cl.
*H01L 27/15* (2006.01)
*H01L 33/60* (2010.01)
(Continued)

(52) U.S. Cl.
CPC .............. *H01L 33/60* (2013.01); *H01L 33/486* (2013.01); *H01L 33/505* (2013.01); *H01L 33/507* (2013.01);
(Continued)

(58) Field of Classification Search
CPC ....... H01L 33/48; H01L 33/483; H01L 33/52; H01L 33/60; H01L 33/62
USPC ........... 438/22–47; 257/79, 99, 100, E33.001
See application file for complete search history.

(56) References Cited

U.S. PATENT DOCUMENTS 5,041,395 A * 8/1991 Steffen ..................... 29/827
6,803,606 B2 10/2004 Takenaka
(Continued)

FOREIGN PATENT DOCUMENTS

EP 2418701 A2 2/2012
JP 7-96634 A 4/1995
(Continued)

OTHER PUBLICATIONS

Bizen Mitsuhiro, JP Pub. 2010-114387, "Light emitting device and method of manufacturing the same, and light emitting diode", (May 20, 2010), Machine English Translation.

*Primary Examiner* — Khiem D Nguyen
(74) *Attorney, Agent, or Firm* — Birch, Stewart, Kolasch & Birch, LLP

(57) ABSTRACT

Provided is a light emitting device. The light emitting device includes a plurality of metal layers spaced from each other, a first insulation film having an opened area in which a portion of the plurality of metal layers is opened, the first insulation film being disposed around top surfaces of the plurality of metal layers, a light emitting chip disposed on at least one of the plurality of metal layers, the light emitting chip being electrically connected to the other metal layer, a resin layer disposed on the plurality of metal layers and the light emitting chip, and a first guide member formed of a non-metallic material, the first guide member being disposed on the first insulation film.

20 Claims, 26 Drawing Sheets

(51) Int. Cl.
*H01L 33/48* (2010.01)
*H01L 33/50* (2010.01)
*H01L 33/58* (2010.01)
*H01L 33/62* (2010.01)
*H01L 33/64* (2010.01)

(52) U.S. Cl.
CPC ................ *H01L 33/58* (2013.01); *H01L 33/62* (2013.01); *H01L 33/642* (2013.01); *H01L 33/647* (2013.01); *H01L 2933/0033* (2013.01); *H01L 2933/0091* (2013.01); *H01L 2224/16245* (2013.01)

(56) References Cited

U.S. PATENT DOCUMENTS

| | | | |
|---|---|---|---|
| 2003/0006702 A1* | 1/2003 | Mueller-Mach et al. | 313/512 |
| 2004/0159850 A1 | 8/2004 | Takenaka | |
| 2004/0180459 A1 | 9/2004 | Hsu | |
| 2005/0011036 A1 | 1/2005 | McCutchen | |
| 2005/0110036 A1* | 5/2005 | Park et al. | 257/99 |
| 2005/0116235 A1 | 6/2005 | Schultz et al. | |
| 2005/0224821 A1 | 10/2005 | Sakano et al. | |
| 2005/0274959 A1* | 12/2005 | Kim et al. | 257/79 |
| 2006/0011928 A1 | 1/2006 | Sorg et al. | |
| 2006/0091416 A1 | 5/2006 | Yan | |
| 2006/0125716 A1 | 6/2006 | Wong et al. | |
| 2007/0012940 A1 | 1/2007 | Suh et al. | |
| 2007/0126020 A1 | 6/2007 | Lin et al. | |
| 2007/0243645 A1* | 10/2007 | Lin et al. | 438/26 |
| 2008/0142831 A1 | 6/2008 | Su | |
| 2008/0224161 A1 | 9/2008 | Takada | |
| 2008/0237624 A1 | 10/2008 | Kang et al. | |
| 2009/0050925 A1 | 2/2009 | Kuramoto et al. | |
| 2009/0206358 A1 | 8/2009 | Chen et al. | |
| 2009/0212316 A1 | 8/2009 | Braune et al. | |

FOREIGN PATENT DOCUMENTS

| | | | | |
|---|---|---|---|---|
| JP | 7-177304 A | 7/1995 | | |
| JP | 2003-282948 A | 10/2003 | | |
| JP | 2004-228387 A | 8/2004 | | |
| JP | 2005-535135 A | 11/2005 | | |
| JP | 2006-173604 A | 6/2006 | | |
| JP | 2006-303458 A | 11/2006 | | |
| JP | 2007-27751 A | 2/2007 | | |
| JP | 2007-513520 A | 5/2007 | | |
| JP | 2007-194517 A | 8/2007 | | |
| JP | 2008-198782 A | 8/2008 | | |
| JP | 2008-227166 A | 9/2008 | | |
| JP | 2010-16329 A | 1/2010 | | |
| JP | 2010-109119 A | 5/2010 | | |
| JP | 2010-114387 | * | 5/2010 | ............ H01L 33/48 |
| JP | 2010-114387 A | 5/2010 | | |
| JP | 3158994 U | 5/2010 | | |
| KR | 10-2001-0027130 A | 4/2001 | | |
| KR | 10-0665219 B1 | 1/2007 | | |
| KR | 10-0691441 B1 | 3/2007 | | |
| KR | 10-0764449 B1 | 10/2007 | | |
| KR | 10-2008-0028071 A | 3/2008 | | |
| KR | 20-0442383 A | 11/2008 | | |
| KR | 20-0442383 Y1 | 11/2008 | | |
| KR | 10-2009-0039261 A | 4/2009 | | |
| KR | 10-2009-0043058 A | 5/2009 | | |
| KR | 10-2010-0028136 A | 3/2010 | | |
| KR | 10-2010-0052978 A | 5/2010 | | |
| KR | 10-2010-0100229 A | 9/2010 | | |
| KR | 10-2010-0135496 A | 12/2010 | | |
| WO | 2004/015769 A1 | 2/2004 | | |
| WO | WO 2008/081794 A1 | 7/2008 | | |

* cited by examiner (a)　　　　　　　　　(b)

LIGHT EMITTING DEVICE AND LIGHING SYSTEM HAVING THE SAME

CROSS-REFERENCE TO RELATED APPLICATIONS

This application is a Continuation of U.S. patent application Ser. No. 13/206,229 filed on Aug. 9, 2011,issued as U.S. Pat. No. 8,519,426, which claims priority under 35 U.S.C. 119(a) to Korean Patent Application No. 10-2010-76425, 10-2010-76422, 10-2010-76462 and 10-2010-76423 filed on Aug. 9, 2010, each of which is hereby incorporated by reference in its entirety.

BACKGROUND

Embodiments relate to a light emitting device and a lighting system having the same.

Light emitting diodes (LEDs) are a kind of semiconductor device for converting electrical energy into light. Such an LED has advantages such as low power consumption, a semi-permanent life cycle, a fast response time, safety, and environment friendly compared to the related art light source such as a fluorescent lamp and an incandescent bulb. Many studies are being in progress in order to replace the existing light sources with LEDs. Also, the LEDs are being increasingly used according to the trend as light sources of a variety of lamps used in indoor and outdoor places and lighting devices such as liquid crystal display devices, scoreboards, and streetlamps.

SUMMARY

Embodiments provide a light emitting device having a new structure and a lighting system having the same.

Embodiments provide a light emitting device including an insulation film for supporting a plurality of metal layers and a light emitting chip electrically connected to the plurality of metal layers and a lighting system having the same.

Embodiments provide a light emitting device in which a resin layer is disposed around a light emitting chip and a guide member is disposed around the resin layer and a lighting system having the same.

In one embodiment, a light emitting device includes: a plurality of metal layers spaced from each other; a first insulation film having an opened area in which a portion of top surface of the plurality of metal layers is opened, the first insulation film being disposed around top surfaces of the plurality of metal layers; a light emitting chip disposed on at least one of the plurality of metal layers, the light emitting chip being electrically connected to the other metal layer; a resin layer disposed on the plurality of metal layers and the light emitting chip; and a first guide member formed of a non-metallic material, the first guide member being disposed on the first insulation film.

In another embodiment, a light emitting device includes: a plurality of metal layers spaced from each other; a first insulation film having an opened area in which a portion of top surface of the plurality of metal layers is opened, the first insulation film being attached to top surfaces of the plurality of metal layers; a light emitting chip disposed on at least one of the plurality of metal layers, the light emitting chip being electrically connected to the other metal layer; a resin layer disposed on the plurality of metal layers and the light emitting chip; and a first guide member formed of a metallic material, the first guide member being disposed on at least one of the first insulation film and the plurality of metal layers.

In further another embodiment, a light emitting device includes: a plurality of metal layers spaced from each other; a first insulation film having an opened area in which a portion of top surface of the plurality of metal layers is opened, the first insulation film being disposed on top surfaces of the plurality of metal layers; an adhesion layer between the plurality of metal layers and the first insulation film; a second insulation film disposed between the plurality of metal layers and having a width wider than an interval between the plurality of metal layers on top surfaces of the plurality of metal layers; a light emitting chip disposed on at least one of the plurality of metal layers; a resin layer disposed on the plurality of metal layers and the light emitting chip; and a first guide member disposed on a top surface of the first insulation film.

The details of one or more embodiments are set forth in the accompanying drawings and the description below. Other features will be apparent from the description and drawings, and from the claims.

DETAILED DESCRIPTION OF THE EMBODIMENTS

Figure 1:
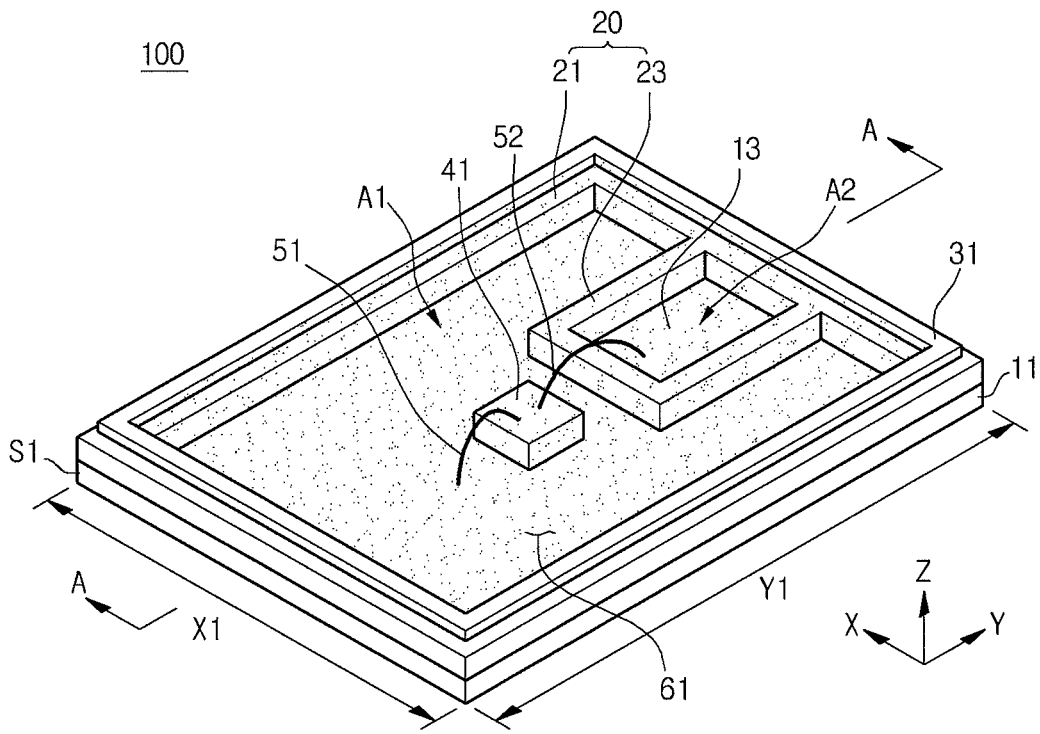
FIG. 1 is a perspective view of a light emitting device according to a first embodiment.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. In the drawings, the thickness or size of each layer is exaggerated, omitted, or schematically illustrated for convenience in description and clarity.

Hereinafter, embodiments will be described with reference to the accompanying drawings.

Figure 2:
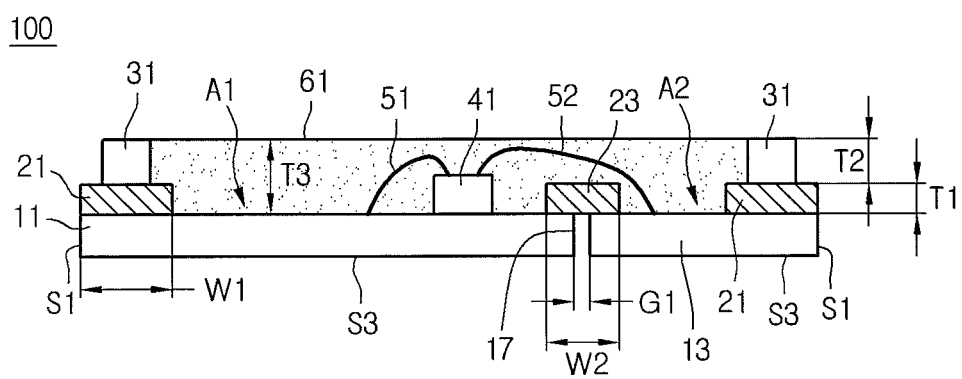
FIG. 2 is a side sectional view taken along line A-A of FIG. 1.

FIG. 1 is a perspective view of a light emitting device according to a first embodiment. FIG. 2 is a side-sectional view taken along line A-A of FIG. 1.

Referring to FIGS. 1 and 2, a light emitting device 100 includes a plurality of metal layers 11 and 13, insulation films 20 (21 and 23) on the metal layers 11 and 13, a light emitting chip 41 on a first metal layer 11 of the plurality of metal layers 11 and 13, a guide member 31 on the insulation films 20, and a resin layer 61 covering the light emitting chip 41 on the metal layers 11 and 13.

The metal layers 11 and 13 may include at least two layers. The at least two metal layers 11 and 13 may be spaced from each other so that the two metal layers 11 and 13 are electrically opened or physically spaced from each other. The metal layers 11 and 13 may be realized using a metal plate such as a lead frame.

Lower surfaces S3 of the plurality of metal layers 11 and 13 may be flush with each other and side surfaces S1 may be exposed to the outside. Thermal efficiency may be improved through the exposed lower surfaces S3 and side surfaces S1 of the metal layers 11 and 13. At least two metal layers 11 and 13 may be used as electrodes, respectively.

The plurality of metal layers 11 and 13 may be formed of Fe, Cu, an alloy containing Fe such as Fe—Ni, Al, an alloy containing Al, or an alloy containing Cu such as Cu—Ni and Cu—Mg—Sn. Also, each of the metal layers 11 and 13 may be provided as a single or multi layer. The metal layers 11 and 13 are formed of a material such as Fe or Cu. Also, a reflective layer formed of Al, Ag, or Au or a bonding layer may be disposed on top and/or lower surfaces of the metal layers 11 and 13.

When the metal layers 11 and 13 are formed with the lead frames, mechanical strength and thermal conductivity may be superior. In addition, a thermal expansion coefficient may be large, machinability may be improved, there may be a little loss when a bending operation is repeatedly performed, and plating or soldering process may be easily performed.

Each of the metal layers 11 and 13 may have a thickness of about 15 μm to about 300 μm, and preferably, about 15 μm to about 50 μm. Also, the metal layers 11 and 13 may serve as a support frame for supporting the entire light emitting device and a heat-dissipating member for conducting heat generated from the light emitting chip 41. In outer areas of the metal layers 11 and 13, a length Y1 of a first direction Y and a length X1 of a second direction X perpendicular to the first direction Y may vary according to a size of the light emitting device 100. The plurality of metal layers 11 and 13 has a same thickness from each other.

The light emitting device 100 may not include a separate body, e.g., a resin-based body formed of polyphthalamide (PPA). Thus, injection and molding processes for coupling the metal layers 11 and 13 to the body may be omitted. A portion of each of the metal layers 11 and 13 may have a flexibly curved shape or be bent at a predetermined angle, but is not limited thereto.

Hereinafter, for description of the first embodiment, the metal layers 11 and 13 including a first metal layer 11 and a second metal layer 13 will be described as an example. Lower surfaces S3 of the first metal layer 11 and the second metal layer 13 may be flush with each other. Also, the first and second metal layers 11 and 13 may be bonded to a printed circuit board (PCB) or a heatsink plate using soldering.

A separation part 17 may be disposed between the first metal layer 11 and the second metal layer 18. The separation part 17 may physically space the first metal layer 11 from the second metal layer 13. The separation part 17 may have one of a straight line shape, a curved line shape, and a bent line shape. The line shape may have a width or shape varying according to shapes or sizes of the first and second metal layers 11 and 13. The separation part 17 divides one metal frame into the first and second metal layers 11 and 13. Also, each of the first and second metal layers 11 and 13 may have a shape or size varying according to a width and position of the separation part 17.

The first and second metal layers 11 and 13 may be spaced an interval G1 of about 10 μm from each other. The interval G1 may be a width of the separation part 17. Also, the separation part 17 may prevent the two metal layers 11 and 13 from being electrically short-circuited to each other. The separation part 17 may be empty or filled with a material, but is not limited thereto.

The first or second metal layer 11 or 13 may have various shapes such as a circular shape, a polygonal shape, and a hemisphere shape through a cutting process.

An oxidation prevention layer may be disposed on surfaces of the first and second metal layers 11 and 13 and is formed of Au layer. The oxidation prevention layer may prevent the surfaces of the first and second metal layers 11 and 13 from being deformed.

Insulation films 21 and 23 may be disposed on the first and second metal layers 11 and 13, respectively. The insulation films 21 and 23 may be disposed around the first metal layer 11 or/and the second metal layer 13.

The insulation films 21 and 23 may be attached to top surfaces of the first and second metal layers 11 and 13 to support the first and second metal layers 11 and 13, respectively. The insulation films 21 and 23 may be attached to top surfaces of the plurality of metal layers 11 and 13 to support the metal layers. Substantially, the insulation films 21 and 23 may perform a function similar to that of the body.

Each of the insulation films 21 and 23 may include a light-transmitting or non-light-transmitting film. For example, each of the insulation films 21 and 23 may include a polyimide (PI) film, a polyethylene terephthalate (PET) film, an ethylene vinyl acetate (EVA) film, a polyethylene naphthalate (PEN) film, a triacetyl cellulose (TAC) film, a polyamide imide (PAI) film, a polyether ether ketone (PEEK) film, a perfluoroalkoxy (PFA) film, a polyphenylene sulfide (PPS) film, and resin films (PE, PP, and PET).

Adhesion layers may be disposed between the insulation films 21 and 23 and the metal layers 11 and 13, respectively. The adhesion layers may attach the insulation films 21 and 23 to the metal layers 11 and 13, respectively. Alternatively, the insulation films 21 and 23 may be a double-sided adhesive tape or a single adhesive tape.

Each of the insulation films 21 and 23 may be formed of a material having a predetermined reflective index, e.g., a reflective index of about 30% or more. The reflection characteristics of the insulation films 21 and 23 may improve surface reflection efficiency within the light emitting device 100.

Also, each of the insulation films 21 and 23 may have an optical function. Here, the optical function may be a function of a light-transmitting film having reflectance of about 50% or more, and preferably, a light-transmitting film having reflectance of about 70%. Each of the insulation films 21 and 23 may include a phosphor. The phosphor may be coated on a top or lower surface of each of the insulation films 21 and 23 or added into the insulation films 21 and 23. The phosphor may include at least one of a YAG-based phosphor, a silicate-based phosphor, and a nitride-based phosphor. The phosphor may have a visible light-based wavelength such as a wavelength of a red, yellow, or green color. Also, each of the insulation films 21 and 23 may be realized as a phosphor film. The phosphor film may absorb light emitted from the light emitting chip 41 to emit light having a different wavelength.

Also, each of the insulation films 21 and 23 may include a moisture resistance film. The moisture resistance film may prevent moisture from being permeated to prevent the first and second metal layers 11 and 13 from being oxidized and short-circuited.

A portion of a top, lower, or side surface of each of the insulation films 21 and 23 may have a roughness structure, but is not limited thereto.

Each of the insulation films 21 and 22 may have a thickness thicker than that of each of the metal layers 11 and 13. For example, each of the insulation films 21 and 22 may have a thickness of about 30 μm to about 500 μm, and preferably, a thickness of about 40 μm to about 60 μm.

The insulation films 21 and 23 may be divided into a first insulation film 21 disposed around top surfaces of the two metal layers 11 and 13 and a second insulation film 23 disposed on a top surface of a boundary area of the first and second metal layers 11 and 13. The second insulation film 23 may be a portion of the first insulation film 21. Also, the second insulation film 23 may be integrally connected to the first insulation film 21. The first and second insulation films 21 and 23 may be formed of the same material and formed as one film.

The first insulation film 21 may have a constant width W1. Alternatively, the first insulation film 21 may have widths different from each other. The first insulation film 21 may have a width W1 of at least several ten μm or more. The second insulation film 23 may have a constant width W2. Alternatively, the second insulation film 23 may have widths different from each other. The second insulation film 23 may have a width W2 wider than the interval G1 between the metal layers 11 and 13. For example, the second insulation film 23 may have a width of about 20 μm or more. The width W1 of the first insulation film 21 may be equal to or different from the W2 of the second insulation film 23. The second insulation film 23 may have a width of at least 20 μm or more to support the two metal layers 11 and 13.

The second insulation film 23 may correspond between the first metal layer 11 and the second metal layer 13. Also, the second insulation film 23 may be disposed on the top surfaces of the first and second metal layers 11 and 13 with a width wider than the interval between the metal layers 11 and 13.

Outer surfaces of the insulation films 21 and 23 may be flush with the side surfaces of the firs and second metal layers 11 and 13. Alternatively, the outer surfaces of the insulation films 21 and 23 may be disposed inside the side surfaces of the first and second metal layers 11 and 13.

Also, the first insulation film 21 may be continuously or discontinuously disposed. The continuous film may have a structure in which one film is provided, and the discontinuous film may have a structure in which plurality of films are provided.

The insulation films 21 and 23 may have open areas A1 and A2. The opened areas A1 and A2 may be holes or opened areas. Also, the opened areas A1 and A2 may be areas in which the top surface(s) of the first metal layer 11 or/and the second metal layer 13 is(are) exposed through the inside of each of the insulation films 21 and 23.

The opened areas A1 and A2 may include a first opened area A1 through which a portion of the top surface of the first metal layer 11 is exposed and a second opened area A2 through which a portion of the top surface of the second metal layer 13 is exposed. The first opened area A1 may have a size and shape equal to or different from those of the second opened area A2. In the current embodiment, although the two opened areas A1 and A2 are provided when the two metal layers 11 and 13 are provided, the number of opened areas may increase if three or more metal layers 11 and 13 are provided. Each of the opened areas A1 and A2 may have a size and shape varying according to a width and shape of each of the insulation films 21 and 23.

One of the plurality of opened areas A1 and A2, e.g., the second opened area S2 may have a minimum width of about 60 μm. When the second opened area A2 has a narrow width, the bonding of a second wire 52 may be interrupted. Thus, the second opened area A2 may have a width of at least 60 μm. The first opened area A1 may have a width enough to mount the light emitting chip 41. Also, the first opened area A1 may have a width wider than that of the second opened area A2. Here, although the first opened area A1 is described as an area on which the light emitting chip 41 is mounted and the second opened area A2 is described as an area to which a second wire 52 is bonded, the present disclosure is not limited thereto. For example, the first opened area A1 may be an area to which a second wire 52 is bonded and the second opened area A2 may be an area on which the light emitting chip 41 is mounted.

The guide member 31 may be disposed on the first insulation film 21. The guide member 31 may be formed of a resin material, a non-metallic material, or a metallic material. The guide member 31 may be defined as a reflective member or/and a dam member for preventing the resin material from overflowing.

The guide member 31 may be formed of a resin material such as solder resist or a conductive material such as solder paste. The solder resist may have a white color. Thus, incident light may be effectively reflected by the white color. Also, the guide member 31 may be formed of a metallic material, e.g., Ag, Al, Cu, Au, Ag-alloy, Al-alloy, Cu-Alloy, or Au-alloy. The metal may be provided as a single or multi layer. Also, the guide member 31 may include a reflective layer on a metal seed layer, e.g., at least one of Ag, Al, and Ni layers through a plating process.

Also, the guide member 31 may be formed of non-metallic material. The non-metallic material may include a resin having a white color, e.g., a resin material (e.g., PPA) having at least one of solder resist, titanium dioxide ($TiO_2$), and glass fiber or a polymer material (e.g., silicon-based or epoxy-based material). Alternatively, the non-metallic material may include a material equal to that of the insulation film.

The guide member 31 may be formed of a metal or non-metallic material having a reflection characteristic of about 50% or more, and preferably, a reflection characteristic of about 90% or more.

The guide member 31 may have a thickness T2 of about 15 μm to about 500 μm. Also, the guide member 31 may have a thickness equal to or different from that of each of the insulation films 21 and 23. The guide member 31 may have a thickness thicker than that of each of the insulation films 21 and 23. The guide member 31 may have a thicker thickness in consideration of distribution of an orientation angle of light.

Also, a top surface of the guide member 31 may be higher than that of the light emitting chip 41 to reflect light.

The guide member 31 may be disposed on the first insulation film 21 to correspond to a surrounding of the light emitting chip 14. The guide member 31 may be a frame, ring, or loop shape when viewed from a top side thereof. The guide member 31 may have a circular or polygonal shape when viewed from a top side thereof. Also, the guide member 31 may prevent the resin layer 61 from overflowing.

The guide member 31 may have a width equal to or different from that of the first insulation film 21. When the guide member 31 has a width equal to that of the first insulation film 21, the surface reflection efficiency may be improved. When the guide member 31 has a width less than that of the first insulation film 21, the guide member 31 may be stably disposed on the first insulation film 21. Since the guide member 31 is disposed along the first insulation film 21, the guide member 31 may have the opened area.

When the guide member 31 has conductivity, the guide member 31 may be disposed on the top surface of the first insulation film 21. Also, a portion of the guide member 31 may contact one of the plurality of metal layers 11 and 13. Also, when the guide member 31 is formed of an insulation material, the guide member 31 may contact top surfaces of the metal layers 11 and 13.

The light emitting chip 41 may be disposed on the first metal layer 11 and electrically connected to the first and second metal layers 11 and 13.

The light emitting chip 41 may be a light emitting diode having a wavelength band of visible light and emitting red, green, blue, or white light or a light emitting diode having a wavelength band of ultraviolet light, but is not limited thereto.

The light emitting chip 41 may be realized as a lateral type chip in which two electrodes are disposed in parallel to each other or a vertical type chip in which two electrodes are disposed on sides opposite to each other. The lateral type chip may be connected to at least two wires 51 and 52, and the vertical type chip may be connected to at least one wire (e.g., reference numeral 52).

The light emitting chip 41 may adhere to the first metal layer 11 using a conductive or insulation adhesive. Here, when an electrode is disposed on a lower portion of the light emitting chip 41, the conductive adhesive may be used. Also, when an insulation substrate is disposed on the lower portion, the conductive adhesive or the insulation adhesive may be used.

The light emitting chip 41 may be connected to the first metal layer 11 using a first wire 51 and the second metal layer 13 using a second wire 52. Also, the light emitting chip 41 may be electrically connected to the first and second metal layers 11 and 13 in a flip chip type.

Although the light emitting chip 41 is disposed on the first metal layer 11, the light emitting chip 41 may be disposed on the first metal layer 11 and/or the second metal layer 13, but is not limited thereto.

The light emitting chip 41 may be connected to the first metal layer 11 using the first wire 51 and the second metal layer 13 using the second wire 52. Here, the light emitting chip 41 may have a thickness of about 80 µm or more. The highest point of one of the wires 51 and 52 may be disposed at a position higher by about 40 µm or more from the top surface of the light emitting chip 41.

A phosphor layer may be coated on the surface of the light emitting chip 41. The phosphor layer may be disposed on the top surface of the light emitting chip 41.

Also, a protective device such as a Zener diode or transient voltage suppressor (TVS) diode for protecting the light emitting chip 41 may be disposed on or under at least one of the first and second metal layers 11 and 13. The protective device may be electrically connected to the light emitting device 41. The protective device may be connected to the first and second metal layers 11 and 13 and connected to the light emitting chip 41 in parallel. Thus, the protective device may protect the light emitting chip 41 against an abnormal voltage applied into the light emitting chip 41. The protective device may be omitted.

The resin layer 61 may be disposed on the first and second metal layers 11 and 13. A portion of the resin layer 61 may be disposed on the top surface of the first insulation film 21. The resin layer 61 is disposed on an opened area inside the guide member 31. The opened area of the guide member 31 may be greater than the first and second opened areas A1 and A2. The resin layer 61 may cover the inner area of the guide member 31, e.g., the first opened area A1 and the second opened area A2. The resin layer 61 may be physically separated from the first opened area A1 and the second opened area A2.

The resin layer 61 may be formed of a transparent resin-based material, e.g., silicon or epoxy resin.

The resin layer 61 may have a thickness T3 of about 80 µm to about 500 µm. The resin layer 61 may be provided as a single or multi layer. When the resin layer 61 has the multi-layered structure, the lowermost layer may have a thickness less than that of about 80 µm.

When the resin layer 61 has the multi-layered structure, the resin layer 61 may be stacked with the same material as or materials different from each other. Alternatively, the multi layers may be stacked in an order of from a layer having a low hardness to a layer having a high hardness or from a layer having a high reflective index to a layer having a low reflective index.

A portion of a top surface of the resin layer 61 may be lower than that of the guide member 31 or higher than that of each of the insulation films 21 and 23. Also, the resin layer 61 may be disposed at a height enough to cover the wires 51 and 52, but is not limited thereto.

The resin layer 61 may include a phosphor. The phosphor may include at least one of phosphors having a wavelength band of visible light such as yellow, green, or red light. The resin layer 61 may be classified into a transparent resin layer and a phosphor layer. The transparent resin layer and the phosphor layer may be stacked to form the resin layer 61. A phosphor film, e.g., a photo luminescent film (PLF) may be disposed above/under the resin layer 61, but is not limited thereto.

A lens may be disposed on the resin layer 61. The lens may have a convex lens shape, a concave lens shape, or a convex-concave lens shape. Also, the lens may contact or be spaced from a top surface of the resin layer 61, but is not limited thereto.

FIGS. 3 to 10 are views illustrating a process of manufacturing the light emitting device of FIG. 1.

Figure 3:
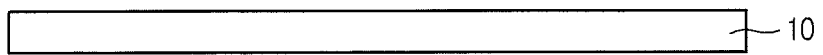
FIGS. 3 to 10 are views illustrating a process of manufacturing the light emitting device of FIG. 1.
Figure 4:
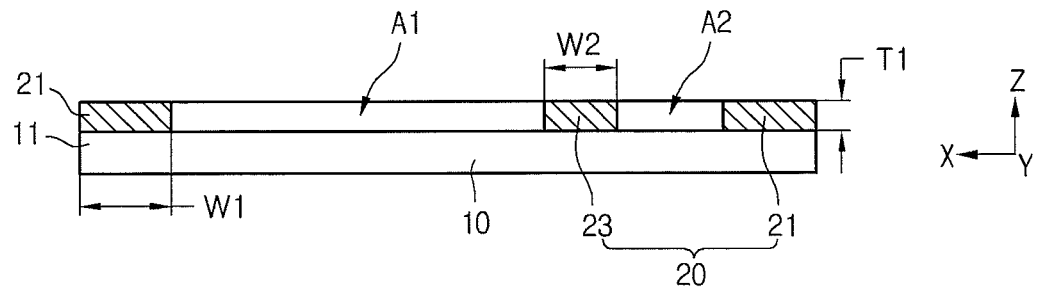

Referring to FIGS. 3 and 4, a metal layer 10 may have a size enough to manufacture one light emitting device as shown in FIG. 1. Alternatively, the metal layer 10 has a size having a bar shape and enough to manufacture a plurality of light emitting devices arrayed in a first direction (horizontal or vertical direction) or a size having a matrix form and enough to manufacture a plurality of light emitting devices arrayed in horizontal and vertical directions. The metal layer for manufacturing the plurality of light emitting devices may be cut into a unit of an individual light emitting device or two or more light emitting devices. Hereinafter, for description of the current embodiment, a metal layer for manufacturing one light emitting device will be described as an example.

For example, the metal layer 10 may be realized as a metal plate such as a lead frame. The metal layer 10 may be formed of Fe, Cu, an alloy containing Fe such as Fe—Ni, Al, an alloy containing Al, or an alloy containing Cu such as Cu—Ni and Cu—Mg—Sn. The metal layer 10 may be formed as a single or multi layer. Also, a reflective layer formed of Al, Ag, Au, or solder resist or a bonding layer may be formed on top and/or lower surfaces of the metal layer 10. The plating process or costing process of the metal layer may be performed before or after insulation films 21 and 23 are formed.

The metal layer 10 may have a thickness of about 15 μm to about 300 μm. Thus, the metal layer 10 may serve as a support frame for supporting the light emitting device.

Since the metal layer 10 is not provided as a separate body, e.g., is not injection-molded with a resin-based body formed of polyphthalamide (PPA), a portion of the metal layer 10 may have a flexibly curved shape or be bent at a predetermined angle.

Figure 5:
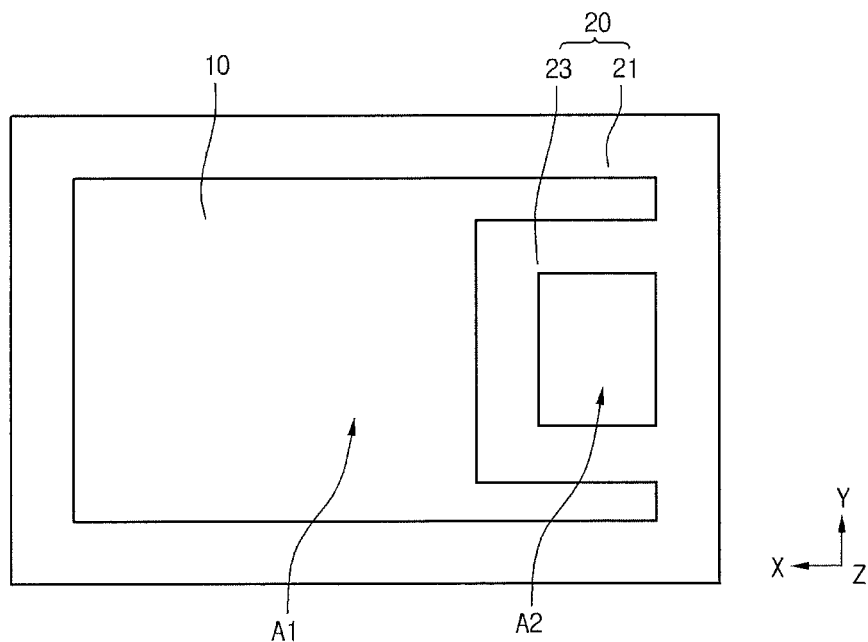

FIG. 4 is a sectional view of an insulation film on the metal layer, and FIG. 5 is a plan view of FIG. 4.

Referring to FIGS. 4 and 5, insulation films 20 (21 and 23) is formed on the metal layer 10. Each of the insulation films 20 (21 and 23) may have a thickness T1 of about 30 μm to about 500 μm in a thickness direction of the metal layer 10. Also, each of the insulation films 20 (21 and 23) may be a thickness thicker than that of the metal layer 10. Here, although the insulation films 20 (21 and 23) are attached to a top surface of the metal layer, the metal layer 10 may be attached to top surfaces of the insulation films 20 (21 and 23). The processes may be changed in order.

The insulation films 20 (21 and 23) may be attached to the metal layer 10 after an adhesion layer is coated on the metal layer 10. In the adhesion process of the insulation films 21 and 23, the insulation films 20 (21 and 23) are attached to the metal layer 10, and then, a lamination process is performed at a predetermined temperature to attach the insulation films 21 and 23 to the metal layer 10.

Each of the insulation films 21 and 23 may be a film having an insulation property. Also, the insulation film 21 and 23 may selectively include films having an optical function, a thermally conductive function, and a moisture resistant function. Each of the insulation films 21 and 23 may include a polyimide (PI) film, a polyethylene terephthalate (PET) film, an ethylene vinyl acetate (EVA) film, a polyethylene naphthalate (PEN) film, a triacetyl cellulose (TAC) film, a polyamide imide (PAI) film, a polyether ether ketone (PEEK) film, a perfluoroalkoxy (PFA) film, a polyphenylene sulfide (PPS) film, and resin films (PE, PP, and PET).

Each of the insulation films 21 and 23 may be formed as a film having an adhesion layer such as a double-sided adhesive tape or a single adhesive tape.

When each of the insulation films 21 and 23 is formed of a light-transmitting material, the insulation films 21 and 23 may include a phosphor or/and a scattering agent. The phosphor or dispersion agent may be coated on surfaces of the insulation films 21 and 23 or added into the insulation films 21 and 23.

Each of the insulation films 21 and 23 may be a film having a predetermined reflective index, e.g., a reflective characteristic of about 30% or more.

The insulation films 21 and 23 may be attached to the metal layer 10 after a plurality of opened areas A1 and A2 are formed. The opened areas A1 and A2 may be holes or opened areas formed in a single film. Also, the opened areas A1 and A2 may be areas in which a top surface of the metal layer 10 is exposed through the inside of each of each of the insulation films 21 and 23. The insulation films 21 and 23 may be divided into a first insulation film 21 formed around the first opened area A1 or the metal layer 10 and a second insulation film 23 formed around the second opened area A2. The second insulation film 23 may be a portion of the first insulation film 21. Also, the second insulation film 23 may be integrally formed with the first insulation film 21. The first and second insulation films 21 and 23 may be realized as a single film.

The first insulation film 21 may have a constant width W1. Alternatively, the first insulation film 21 may have widths different from each other. The first insulation film 21 may have a width W1 of several ten μm or more. The second insulation film 23 may have a constant width W2. Alternatively, the first insulation film 23 may have widths different from each other. The second insulation film 23 may have a width W2 greater than an interval G1 between the metal layers 11 and 13. For example, the second insulation film 23 may have a width of about 20 μm or more. The width W1 of the first insulation film 21 may be equal to or different from the W2 of the second insulation film 23.

One of the plurality of opened areas A1 and A2, e.g., the second opened area A2 may have a minimum width of about 60 μm. The second opened area A2 may have a width at which a bonding process of a wire is not interrupted. The first opened area A1 may have a width enough to mount a light emitting chip. Also, the first opened area A1 may have a width wider than that of the second opened area A2. Here, although the first opened area A1 is described as an area on which the light emitting chip is mounted and the second opened area A2 is described as an area to which the wire is bonded, the present disclosure is not limited thereto. For example, the first opened area A1 may be an area to which the wire is bonded and the second opened area A2 may be an area on which the light emitting chip is mounted.

A punching process, a cutting process, or an etching process may be performed on a single insulation film to form the first opened area A1 and the second opened area A2. The first and second opened areas A1 and A2 may be changed in width or shape. The opened areas A1 and A2 may be formed before or after the insulation films 20 (21 and 23) are attached to the metal layer 10.

A top surface of the metal layer 10 may be exposed through the first and second opened areas A1 and A2 of the insulation films 21 and 23.

For example, each of the insulation films 21 and 23 may be printed or coated with an insulation material such as oxide such as sapphire ($Al_2O_3$), $SiO_2$, $SiO_x$, or $SiO_xN_y$, or nitride. In this case, the cured insulation films 21 and 23 may be formed of a material which is flexible or has a predetermined viscosity.

Each of the insulation films 21 and 23 may have an inner surface or a predetermined inner area having a mesh shape or a roughness shape. Alternatively, a plurality of fine holes may be formed in the insulation films 21 and 23, but is not limited thereto.

Figure 6:
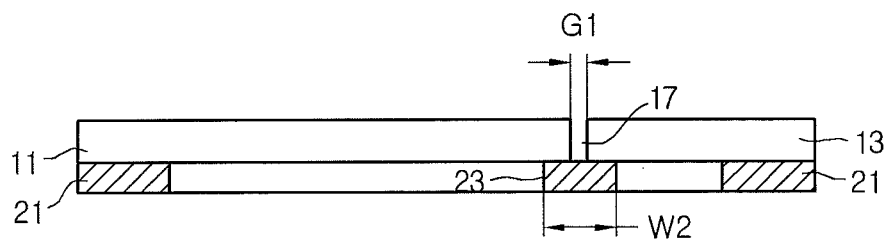
Figure 7:
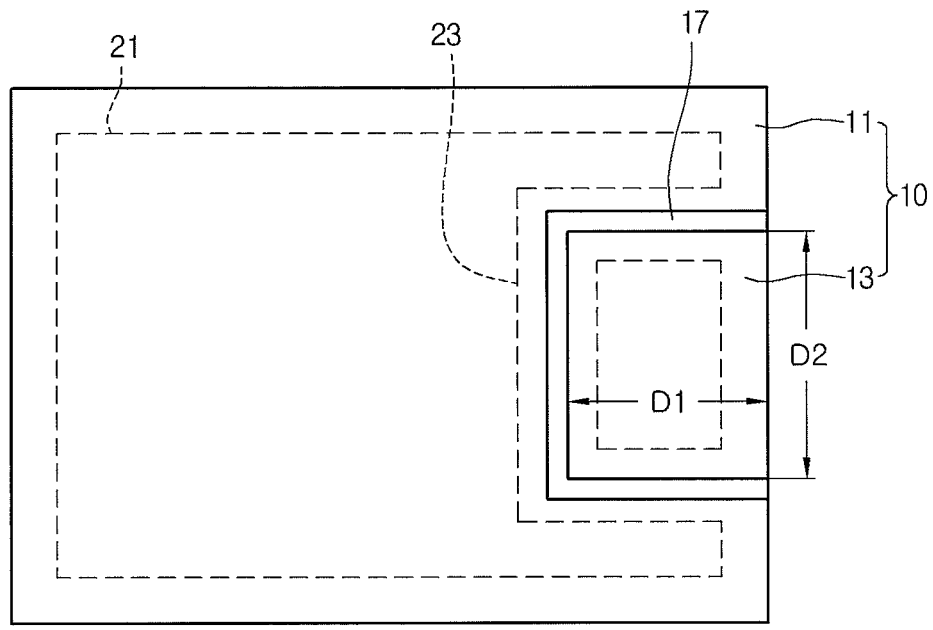

Referring to FIGS. 6 and 7, the metal layer 10 of FIG. 4 may be divided into a plurality of metal layers 11 and 13. The plurality of metal layers 11 and 13 may include at least two metal layers. The at least two metal layers 11 and 13 may be used as electrodes for supplying a power.

Here, in a process for forming a circuit of the metal layer, for example, after a surface of the lead frame is activated, a photoresist may be coated, an exposure process may be performed, and a developing process may be performed. When the developing process is completed, an etching process may be performed to form a required circuit and exfoliate the photoresist. Thereafter, an Ag plating process may be performed on a surface of the metal layer to treat the surface of the metal layer to a bondable surface.

The first metal layer 11 may have a width equal to or different from that of the second metal layer 13. For example, the first metal layer 11 may have a size greater or less than that of the second metal layer 13. Alternatively, the first and second metal layers 11 and 13 may have the same area as each other or shapes symmetric to each other.

A predetermined separation part 17 may be disposed between the first and second metal layers 11 and 13 to space the first metal layer 11 from the second metal layer 13. The first and second metal layers 11 and 13 may be spaced an interval G1 of about 10 μm or more from each other. The interval G1 may be less than a width W1 of the second insulation film 23.

The second insulation film 23 may maintain the interval G1 between the first and second metal layers 11 and 13, and the first insulation film 21 may support the metal layers 11 and 13.

Here, the second metal layer 13 may extend inward through one side surface of the first metal layer 11. The second meal layer 13 may have left and right lengths D1 and D2 which vary according to the second opened area A2 and the insulation films 21 and 23.

Figure 8:
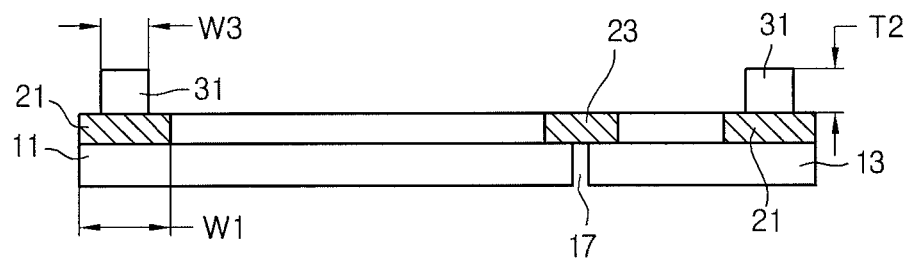

Referring to FIGS. 6 and 8, a guide member 31 is formed on top surfaces of the insulation films 21 and 23. One of a printing process, a costing process, or a film adhesion process may be performed to form the guide member 31. In the printing process, a masking process may be performed on an area except an area to be printed and a screen printing process may be performed to form the guide member 31. In the coating process, a reflective material may be coated to form the guide member 31. In the film adhesion process, a film such as a reflective sheet may adhere to form the guide member 31. Here, materials of the guide member 31 and the insulation films 21 and 23 may be selected in consideration of thermal characteristics due to a wire bonding or reflow process.

The guide member 31 may be formed in the printing manner using solder resist or solder paste. The solder resist may have a white color to effectively reflect incident light. Also, the guide member 31 may be formed of a high-reflective material, e.g., Ag, Al, Cu, Au, Ag-alloy, Al-alloy, Cu-Alloy, or Au-alloy. The reflective material may be provided as a single or multi layer. Also, a plating process may be performed on a metal seed layer, e.g., on a material such as Ag, Al, or Ni to form the guide member 31.

Also, the guide member 31 may be formed of a non-metallic material. The non-metallic material may include a white resin, for example, a resin (e.g., PPA) in which $TiO_2$ and glass fiber are mixed. When the guide member 31 has insulating and reflective characteristics, a separate insulation film may be unnecessary, but is not limited thereto.

The guide member 31 may be formed of a metal or non-metal material having a reflection characteristic of about 50% or more, and preferably, a reflection characteristic of about 90% or more.

The guide member 31 may have a thickness T2 of about 15 μm to about 500 μm. Also, the guide member 31 may have a thickness equal to or different from that of each of the insulation films 21 and 23. The guide member 31 may have a thickness T2 and an arrangement structure which vary in consideration of distribution of an orientation angle of light.

The guide member 31 may be formed on the first insulation film 21 to cover a surrounding of the light emitting chip 14. The guide member 31 may be a frame, ring, or loop shape when viewed from a top side. The guide member 31 may be continuously or discontinuously formed on the top surface of the first insulation film 21

The guide member 31 may have a width W3 equal to or different from that of the first insulation film 21. When the guide member 31 has a width equal to that of the first insulation film 21, the surface reflection efficiency may be improved. When the guide member 31 has a width different from that of the first insulation film 21, the guide member 31 may be stably disposed on the first insulation film 21.

When the guide member 31 has conductivity, the guide member 31 may be disposed on the top surface of the first insulation film 21. Also, a portion of the guide member 31 may contact one of the two lead frames 11 and 13. Also, when the guide member 31 is formed of an insulation material, the guide member 31 may extend from the top surface of the first insulation film 21 to the top surfaces of the metal layers 11 and 13.

Figure 9:
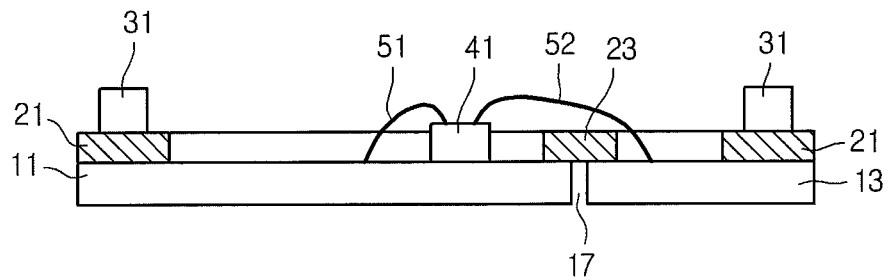

Referring to FIGS. 8 and 9, the light emitting chip 41 may be disposed on the first metal layer 11 and electrically connected to the first and second metal layers 11 and 13.

The light emitting chip 41 may be a light emitting diode having a wavelength band of visible light and emitting red, green, blue, or white light or a light emitting diode having a wavelength band of ultra violet ray, but is not limited thereto.

The light emitting chip 41 may be realized as a lateral type chip in which two electrodes are disposed in parallel to each other or a vertical type chip in which two electrodes are disposed on sides opposite to each other. The lateral type chip may be connected to at least two wires 51 and 52, and the vertical type chip may be connected to at least one wire (e.g., reference numeral 52).

The light emitting chip 41 may adhere to the first metal layer 11 using a conductive or insulation adhesive. Here, when an electrode is disposed on a lower portion of the light emitting chip 41, the conductive adhesive may be used. Also, when an insulation substrate is disposed on the lower portion, the conductive adhesive or the insulation adhesive may be used.

The light emitting chip 41 may be connected to the first metal layer 11 using a first wire 51 and the second metal layer 13 using a second wire 51. Also, the light emitting chip 41 may be electrically connected to the first and second metal layers 11 and 13 in a flip chip type.

Although the light emitting chip 41 is disposed on the first metal layer 11, the light emitting chip 41 may be disposed on the first metal layer 11 and/or the second metal layer 13, but is not limited thereto.

The light emitting chip 41 may be connected to the first metal layer 11 using the first wire 51 and the second metal layer 13 using the second wire 52. Here, the light emitting chip 41 may have a thickness of about 80 μm or more. The highest point of one of the wires 51 and 52 may be disposed at a position higher by about 40 μm or more from the top surface of the light emitting chip 41.

Figure 10:
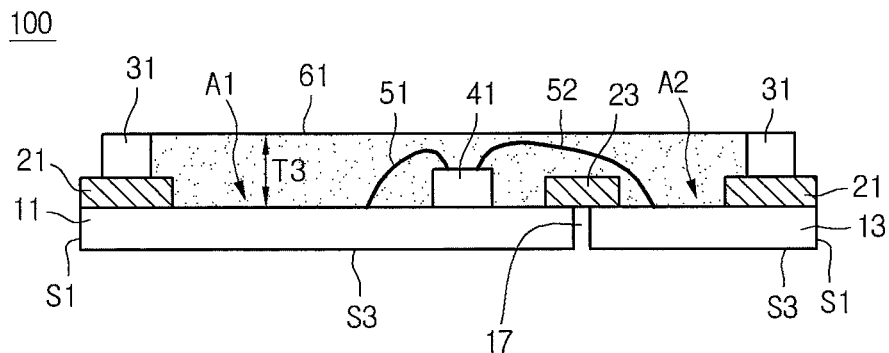

Referring to FIGS. 9 and 10, the resin layer 61 may be formed of a transparent resin-based material, e.g., silicon or epoxy resin.

The resin layer 61 may have a thickness T3 of about 80 μm to about 500 μm. The resin layer 61 may be provided as a single or multi layer. When the resin layer 61 has the multi-layered structure, the lowermost layer may have a thickness less than that of about 80 μm.

When the resin layer 61 has the multi-layered structure, the resin layer 61 may be stacked with the same material as or materials different from each other. Alternatively, the multi layers may be stacked in an order of from a material having a low hardness to a material having a high hardness or from a material having a high reflective index to a material having a low reflective index.

A portion of a top surface of the resin layer 61 may be lower than that of the guide member 31 or higher than that of each of the insulation films 21 and 23. Also, the resin layer 61 may be disposed at a height enough to cover the wires 51 and 52, but is not limited thereto.

The resin layer 61 may include a phosphor. The phosphor may include at least one of phosphors having a wavelength band of visible light such as yellow, green, or red light. The resin layer 61 may be classified into a transparent resin layer and a phosphor layer. The transparent resin layer and the phosphor layer may be stacked to form the resin layer 61. A phosphor film, e.g., a photo luminescent film (PLF) may be disposed above/under the resin layer 61, but is not limited thereto.

The resin layer 61 may cover the inner area of the guide member 31, e.g., the first opened area A1 and the second opened area A2. The resin layer 61 may be physically separated from the first opened area A1 and the second opened area A2.

A lens may be disposed on the resin layer 61. The lens may have a convex lens shape, a concave lens shape, or a convex-concave lens shape, but is not limited thereto. Also, the lens may contact or be spaced from a top surface of the resin layer 61, but is not limited thereto.

Figure 11:
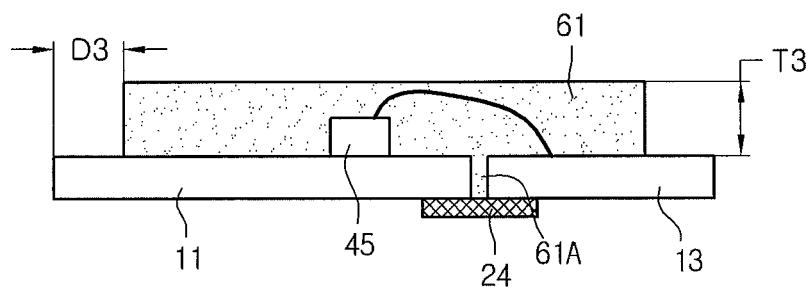
FIGS. 11 and 12 are side sectional views of a light emitting device according to second and third embodiments.

FIG. 11 is a side sectional view of a light emitting device according to a second embodiment.

Referring to FIG. 11, a light emitting chip 41 may be bonded on a first metal layer 11. Also, the light emitting chip 41 may be electrically connected to the first metal layer 11 and connected to a second metal layer 13 through a wire 52.

An insulation film 24 may be attached to a lower side between the first metal layer 11 and the second metal layer 13. The insulation film 24 may maintain a predetermined interval between the first metal layer 11 and the second metal layer and support a portion between the first metal layer 11 and the second metal layer 13.

A resin layer 61 is disposed on the first metal layer 11 and the second metal layer 13. The resin layer 61 may be injection-molded in a predetermined shape through a transfer molding method. According to the transfer molding method, a liquid resin is filled into a frame having a predetermined shape and then cured so that the resin layer 61 having a desired shape may be formed. The resin layer 61 may have a cylindrical shape, a polygonal column shape, or uneven surface shape, but is not limited thereto.

A portion 61A of the resin layer 61 may be disposed between the first metal layer 11 and the second metal layer 13 and may contact a top surface of the insulation film 24.

An outer surface of the resin layer 61 may be spaced a predetermined interval T3 inward from an outer part of the first metal layer 11 or the second metal layer 13. Accordingly, the outer top surfaces of the first metal layer 11 and the second metal layer 13 may be exposed. The interval T3 may be about 1 μm or more.

Also, a reflective layer may be further disposed on a portion of a top surface or a side surface of the resin layer 61, but is not limited thereto.

Figure 12:
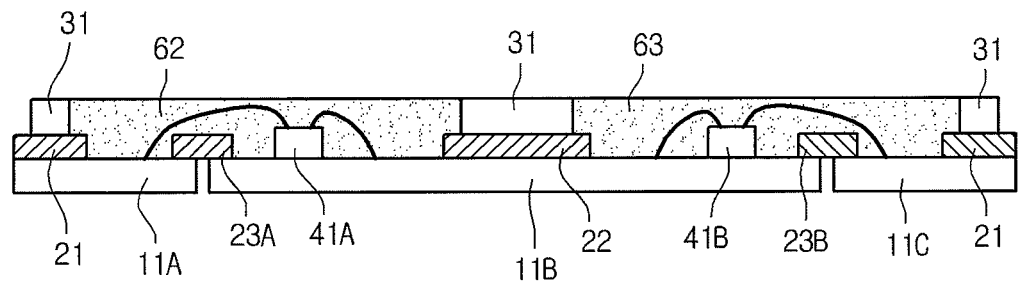

FIG. 12 is a side sectional view of a light emitting device including a plurality of light emitting chips according to a third embodiment.

Referring to FIG. 12, a light emitting device includes three or more metal layers 11A, 11B, and 11C and two or more light emitting chips 41A and 41B. The light emitting chips 41A and 41B may emit light having the same peak wavelength as or peak wavelengths different from each other.

The metal layers 11A, 11B, and 11C are arrayed on the same plane. A first insulation film 21 is disposed around the metal layers 11A, 11B, and 11C. Second insulation films 23A and 23B are respectively disposed between the metal layers 11A and 11B, and 11B and 11C adjacent to each other to support and fix the metal layers 11A and 11B, and 11B and 11C adjacent to each other. The third insulation layer 22 may be disposed at a center side of the second metal layer 11B and divided into two areas.

The first to third insulation films 21, 23A, 23B, and 22 may be provided as a single film or films separated from each other, but are not limited thereto.

A first light emitting chip 41A and a second light emitting chip 41B are spaced from and disposed on the second metal layer 11B. A third insulation film 22 is disposed between the first light emitting chip 41A and the second light emitting chip 41B.

A guide member 31 is disposed on the first insulation film 21 and the third insulation film 22. The guide member 31 is disposed at a position higher than a top surface of the light emitting chip 41 to reflect light emitted from the light emitting chips 41A and 41B.

Resin layers 62 and 63 are disposed on the first and second light emitting chips 41A and 41B, respectively. A portion of each of the resin layers 62 and 63 may be disposed at the same height as or a height less than a top surface of the guide member 31, but are not limited thereto.

The second metal layer 11B may serve as common electrodes of the first light emitting chip 41A and the second light emitting chip 41B. The first metal layer 11A may serve as an electrode for controlling the first light emitting chip 41A, and the third metal layer 11C may serve as an electrode for controlling the second light emitting chip 41B.

According to the current embodiment, although it is described that the two light emitting chips 41A and 41B are disposed at the left and right sides, three or more light emitting chips may be disposed in a matrix form or in a line shape crossing the same center. The light emitting chips may be connected to each other in series or parallel, but is not limited thereto. Also, when a center portion of the third insulation film 22 is cut, the light emitting device may be manufactured into two light emitting devices.

Figure 13:
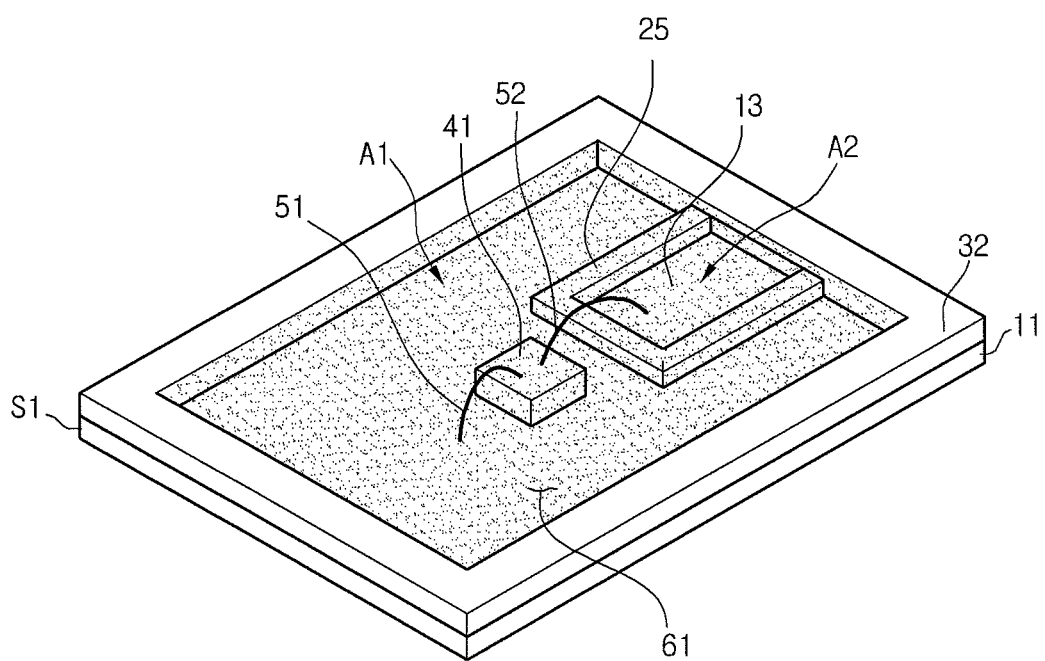
FIGS. 13 and 14 are perspective and side sectional views of a light emitting device according to a fourth embodiment.
Figure 14:
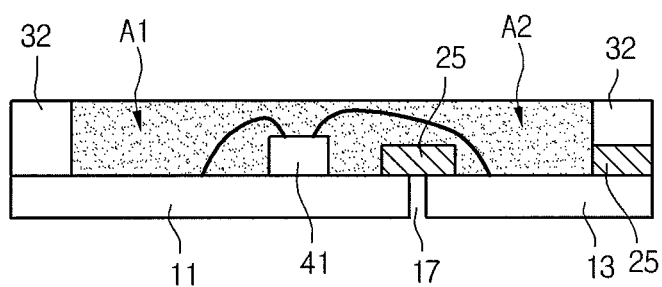

FIGS. 13 and 14 are perspective and side sectional views of a light emitting device according to a fourth embodiment.

Referring to FIGS. 13 and 14, an insulation film 25 adheres to a circumference on a top surface of a second metal layer 13 to support a first metal layer 11 and a second metal layer 13. The insulation film 25 covers a separation part 17 between the first metal layer 11 and the second metal layer 13 to support a portion between the first metal layer 11 and the second metal layer 13.

A guide member 32 is disposed around a top surface of the first metal layer 11. A portion of the guide member 32 may be disposed on an outer top surface of the insulation film 25. The guide member 32 may be disposed around the top surface of the first metal layer 11 and on the outer top surface of the insulation film 25. The guide member 32 may be electrically connected on the top surface of the first metal layer 11 and electrically separated from the top surface of the second metal layer 13 by the insulation film 25. The guide member 32 may be disposed around the first metal layer 11 and the insulation film 25 in a loop shape, a frame shape, or a ring shape. The insulation film 25 may be disposed around the top surface of the second metal layer 13 in a loop shape, a frame shape, or a ring shape.

The insulation film 25 may prevent the guide member 32 from physically or electrically contacting the second metal layer 13 and prevent the first and second metal layers 11 and 13 from being short-circuited. The insulation film 25 and the guide member 32 may support and fix the two metal layers 11 and 13 adjacent to each other. The guide member 31 may have a thickness equal to that of the resin layer 61.

According to the current embodiment, the insulation film 25 may decrease in area and the guide member 32 may increase in area to improve optical reflection efficiency.

Figure 15:
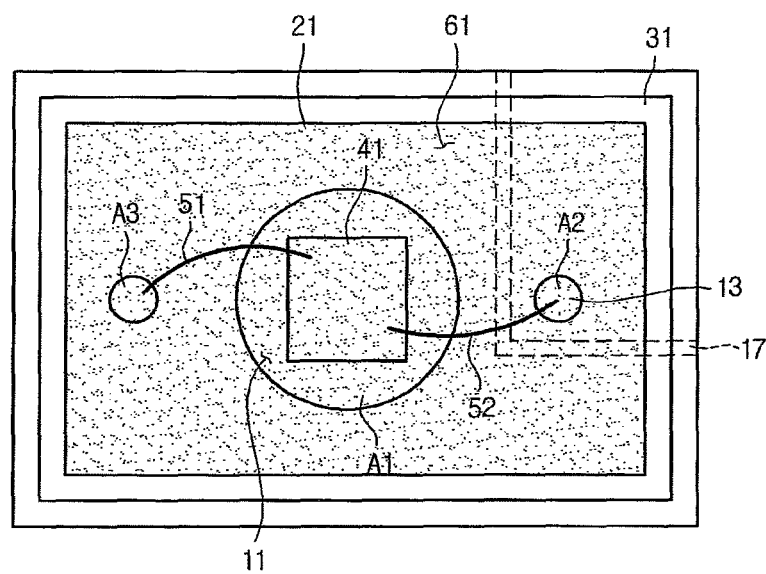
FIGS. 15 and 16 are plan and side sectional views of a light emitting device according to a fifth embodiment.
Figure 16:
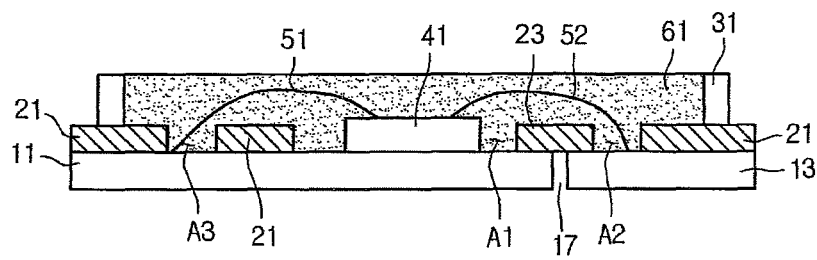

FIGS. 15 and 16 are plan and side sectional views of a light emitting device according to a fifth embodiment.

Referring to FIGS. 15 and 16, insulation films 21 and 23 are disposed on entire top surfaces of the first and second metal layers 11 and 13 and include a plurality of opened areas A1, A2, and A3. A plurality of opened areas A1, A2, and A3 include a first opened area A1 on which a light emitting chip 41 is mounted on a first metal layer 11, a second opened area A2 to which a second wire 52 is bonded on a second metal layer 12, and a third opened area A3 to which a first wire 51 is bonded on the first metal layer 11. As another example, the third bonding area A3 may not be defined when the light emitting chip 41 has a vertical type electrode structure.

Each of the first to third opened areas A1, A2, and A3 may have a circular shape or a polygonal shape. Here, the second opened area A2 may be formed with a size which is less by at least four times or less than a lower area of the light emitting chip 41. Each of the first and third opened areas A1 and A3 may have width or diameter greater than a diameter (e.g., about 20 μm to about 50 μm) of a wire, for example, about 60 μm to about 120 μm.

Since an adhesion area of each of the insulation films 21 and 23 is wider than that of the structure of FIG. 1, the first metal layer 11 and the second metal layer 13 may be more firmly supported. A guide member 31 may be disposed around a top surface of each of the insulation films 21 and 23. A resin layer 61 may be molded inside the guide member 31.

Figure 17:
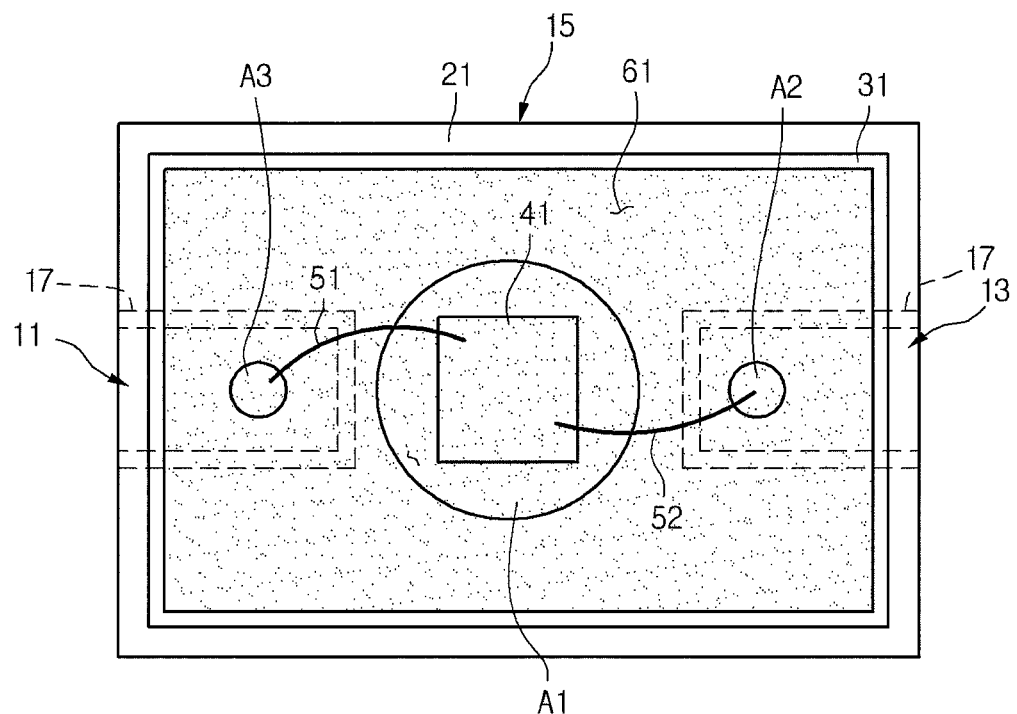
FIG. 17 is a view illustrating a modified example of the light emitting device of FIG. 15.

FIG. 17 is a plan view illustrating another example of FIG. 15.

Referring to FIG. 17, a light emitting device includes three metal layers 11, 13, and 15 and an insulation film 21 attached on the metal layers 11, 13, and 15. A plurality of opened areas A1, A2, and A3 are defined on an insulation film 21. The plurality of opened areas A1, A2, and A3 may open portions of top surfaces of metal layers 11, 13, and 15, respectively.

The third metal layer 15 is disposed between the first metal layer 11 and the second metal layer 13. A light emitting chip 41 is mounted on the third metal layer 15. The light emitting chip 41 is disposed on a first opened area A1 of the insulation film 21. Also, a second open area A2 and a third open area A3 may be wire bonding areas.

The light emitting chip 41 is connected to the first metal layer 11 on the third open area A3 through a first wire 51 and is connected to the second metal layer 13 on the second open area A2 through a second wire 52.

The opened areas A1, A2, and A3 of the insulation film 21 are areas in which the light emitting chip 41 and the wires 51 and 52 are disposed on the top surfaces of the metal layers 11, 13, and 15. Also, the insulation film 21 may firmly support a portion between the metal layers 11, 13, and 15 and prevent a stepped portion between the metal layers 11, 13, and 15 from occurring to improve electrical reliability due to solder bonding and also improve thermal transfer efficiency.

FIGS. 18 to 27 are views illustrating modified examples of a metal layer and an insulation film according to an embodiment.

Figure 18:
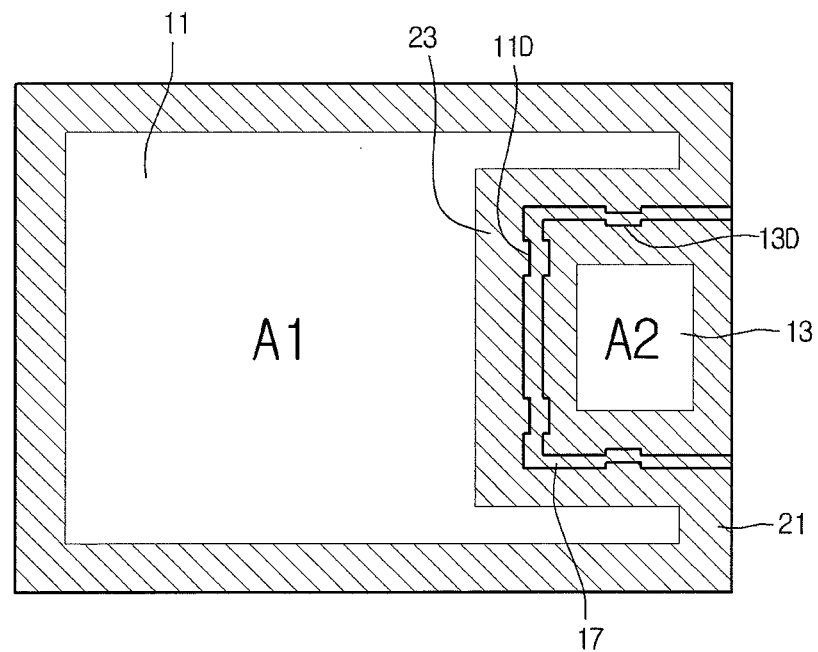
FIGS. 18 to 27 are views illustrating modified examples of a metal layer and an insulation film according to an embodiment.

Referring to FIG. 18, a second metal layer 13 may be disposed on at least portion of a first metal layer 11 and may have a circular shape, a polygonal shape, or a random shape at a side of the first metal layer 11. A separation part 17 between the first metal layer 11 and the second metal layer 13 may have a uniform or irregular width.

The first metal layer 11 and the second metal layer 13 may have surfaces mutually corresponding to each other and having roughness structures 11D and 13D. The roughness structures 11D and 13D may improve the adhesion efficiency of the second insulation film 23.

Figure 19:
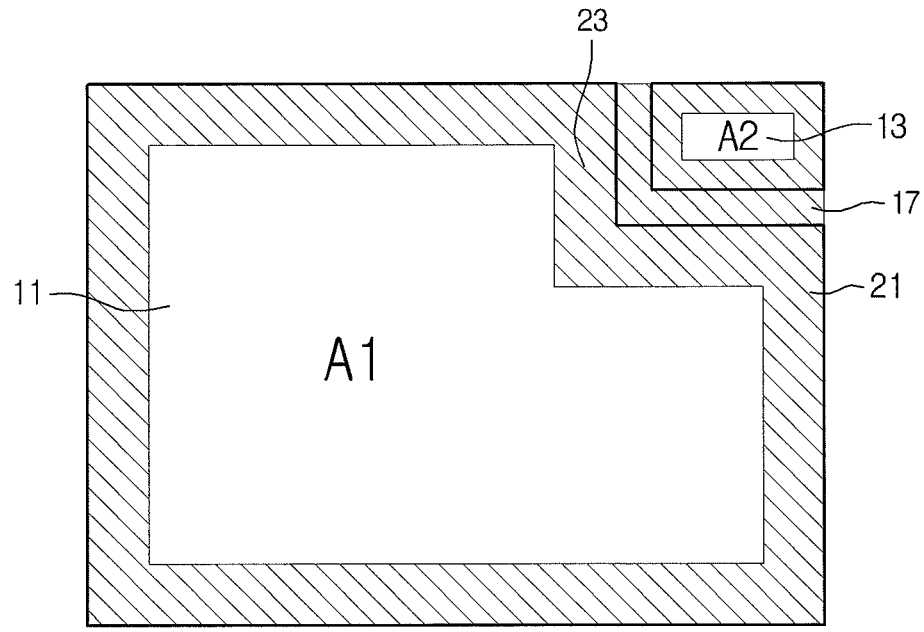

As shown in FIG. 19, the second metal layer 13 may be disposed in a predetermined shape, e.g., a circular or polygonal shape, on at least one edge of the first metal layer 11.

Figure 20:
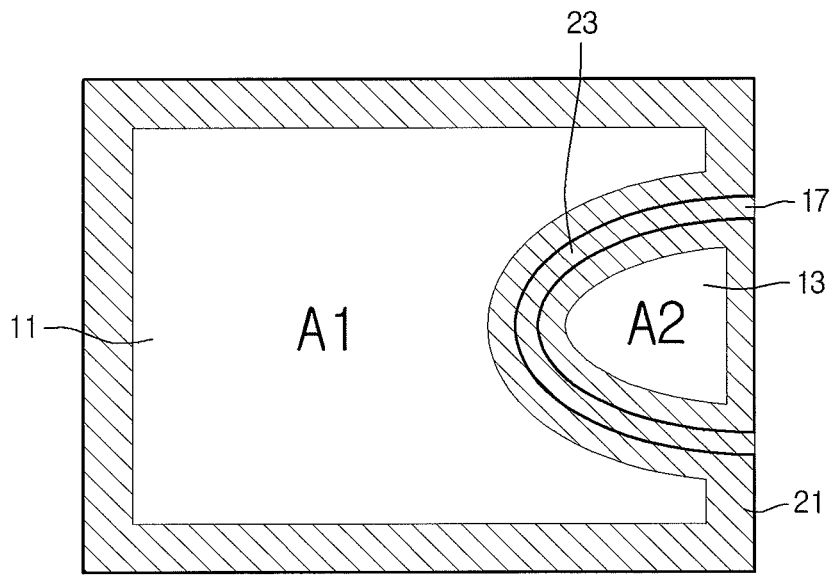
Figure 21:
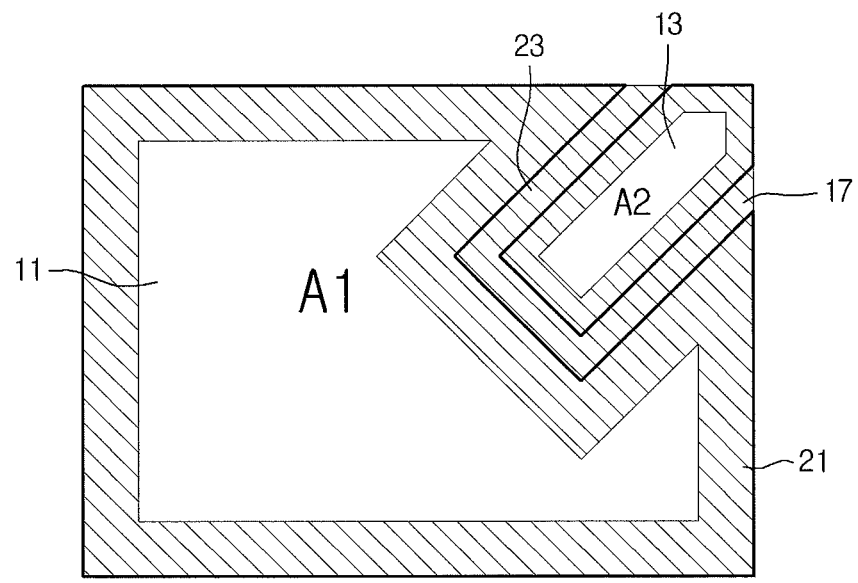

As shown in FIGS. 20 and 21, the second metal layer 13 may be have a hemispherical shape on at least portion of the first metal layer 11 or may have a polygonal shape on an edge of the first metal layer 11.

Figure 22:
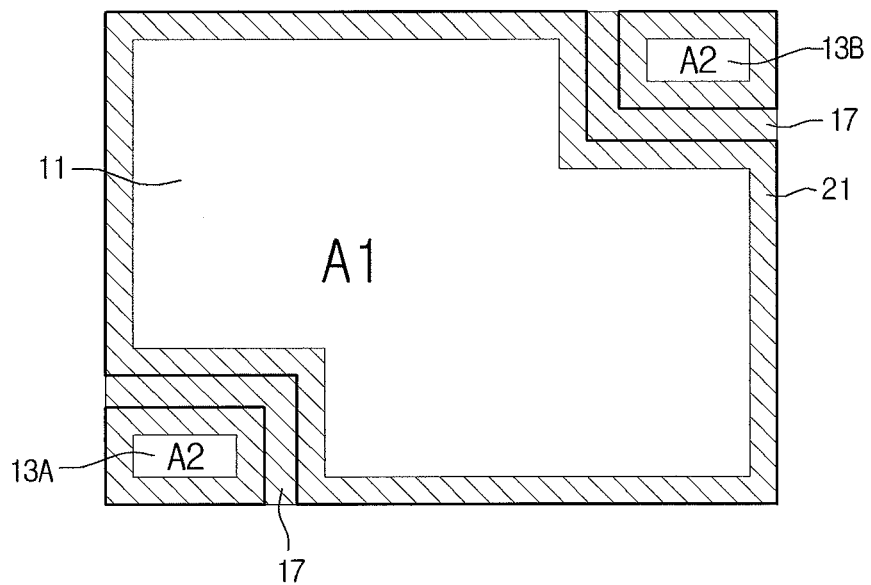

As shown in FIG. 22, the second and third metal layers 13A and 13B have a circuit or polygonal shape on at least two edges of the first metal layer 11. The second and third metal layers 13A and 13B may be disposed on the edges facing each other of the first metal layer 11. The second and third metal layers 13A and 13B may serve as electrodes, respectively. One of the second and third metal layers 13A and 13B may serve as a dummy pattern. The insulation films 21 and 23 may be disposed around the three metal layers 11, 13A, and 13B. Also, the insulation films 21 and 23 may expose top surfaces of the three metal layers 11, 13A, and 13B through the opened areas A1 and A2.

Figure 23:
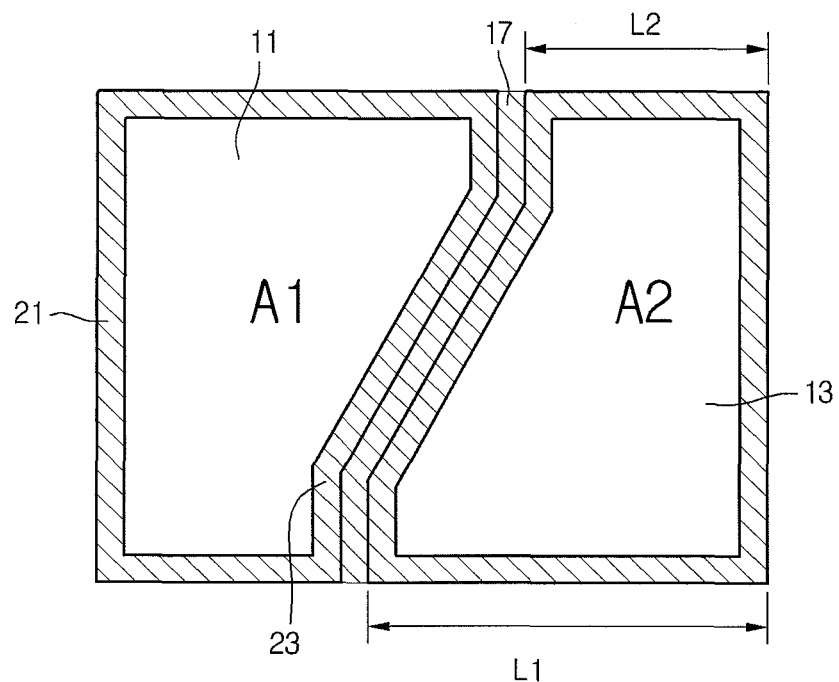

As shown in FIG. 23, the first metal layer 11 and the second metal layer 13 are divided by the separation part 17 at a center side thereof. Also, the first and second metal layers 11 and 13 may have the same area as or symmetrical to each other. A length L1 of a first side of the second metal layer 13 may be less than that L2 of a second side opposite to the first side, but is not limited thereto.

Figure 24:
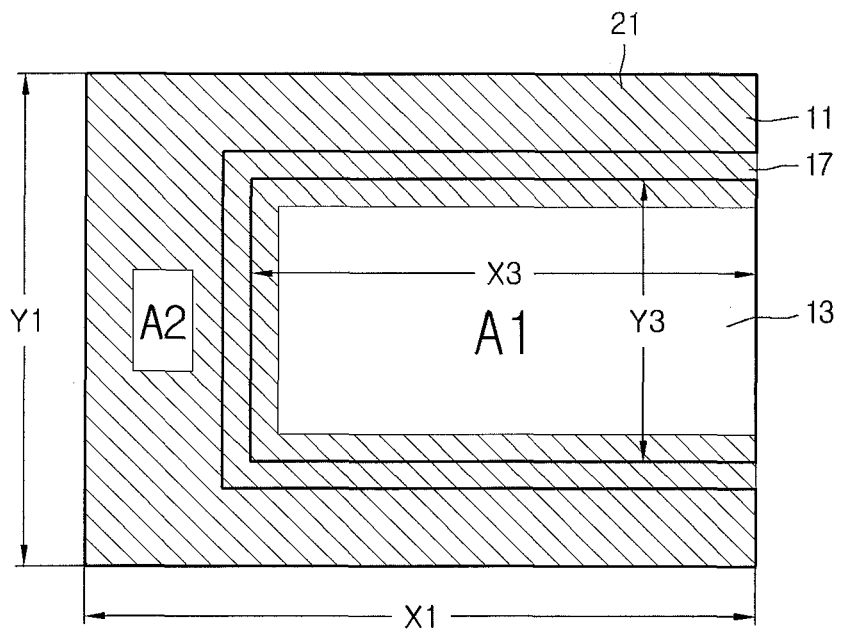

Referring to FIG. 24, the second metal layer 13 may be disposed on a portion of the first metal layer 11. The second metal layer 13 may have a first direction width X3 having a size of about ½ times than a second direction width X2 of the second metal layer 11.

The second metal layer 13 may have a first direction width Y3 having a size of about ½ times than a second direction width Y1 of the first metal layer 11.

An insulation film 21 is disposed on a boundary between the first and second metal layers 11 and 13. The insulation film 21 covers an area except the second opened area A2. An outer top surface of the second metal layer 13 may be exposed without providing the insulation film 21.

A light emitting chip may be mounted on the opened area A1 of the second metal layer 13. The light emitting chip may be electrically connected to the two metal layers 11 and 13.

Figure 25:
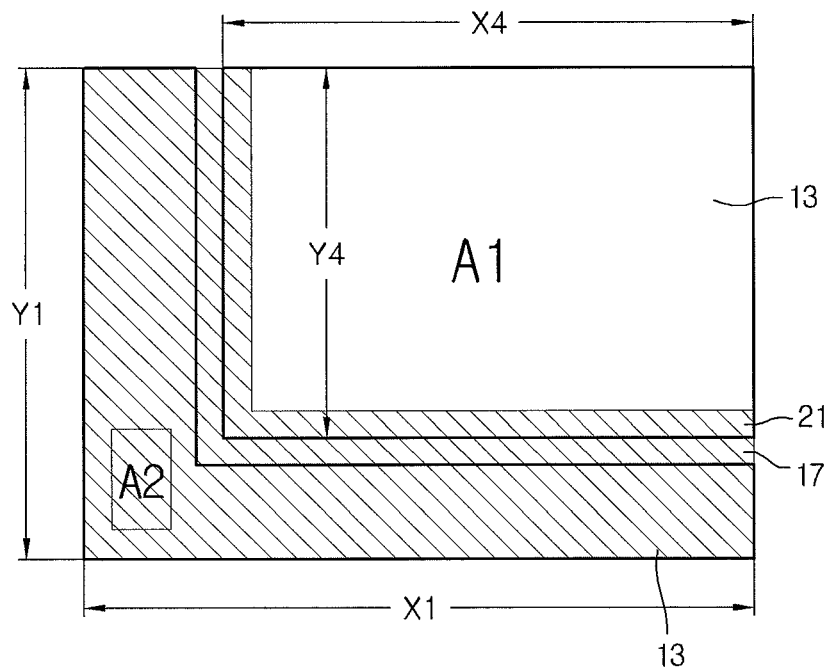

Referring to FIG. 25, the second metal layer 13 may be disposed on an edge portion of the first metal layer 11. A first direction width X4 and a second direction width Y4 of the second metal layer 13 may be about ½ times or more than the first direction width X1 and the second direction widths X1 and Y1 of the first metal layer 11.

Since a guide member is disposed without providing an insulation film on an outer top surface of the second metal layer 13, an area covered by the guide member may be improved.

Figure 26:
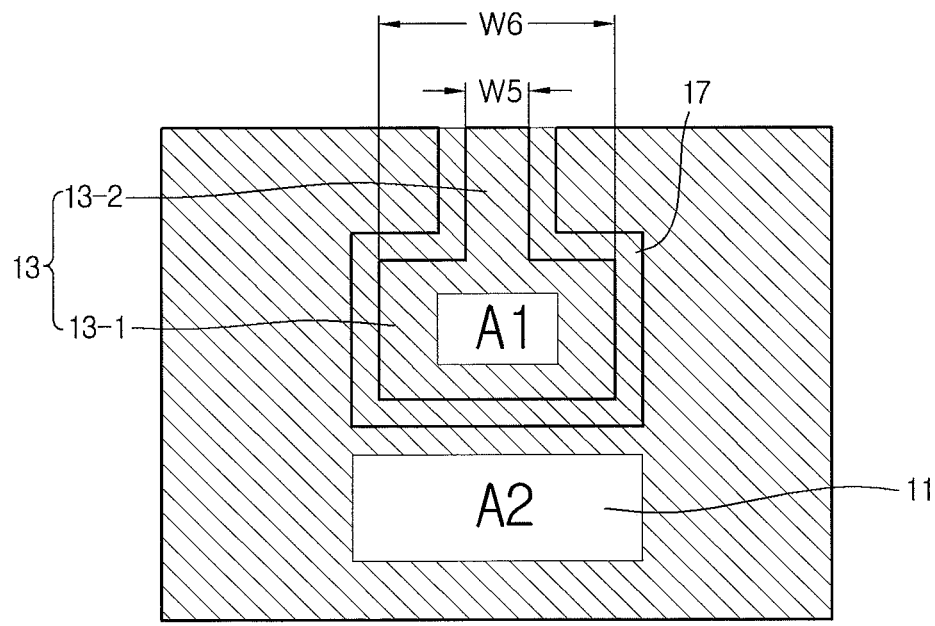

Referring to FIG. 26, the second metal layer 13 may extend up to the inside of the first metal layer 11 through one side surface of the first metal layer 11 or may be disposed inside the first metal layer 11.

A width W5 of an outer part 13-1 of the second metal layer 13 may be narrower than a width W6 of an inner part 13-2. The light emitting chip may be disposed on the first opened area A1 of the second metal layer 13, but is not limited thereto.

Figure 27:
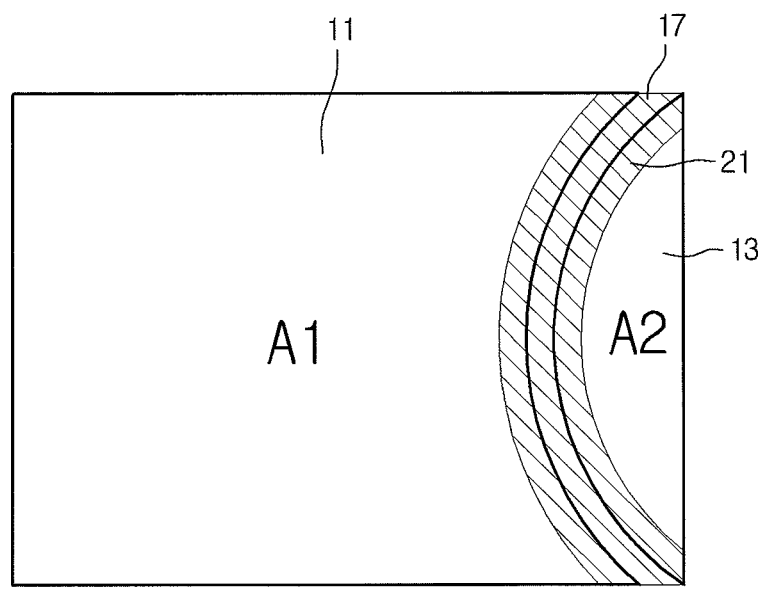

Referring to FIG. 27, the second metal layer 13 may have a diameter as long as a width of the first metal layer 11 and have a hemispheric shape. An insulation film 21 may be disposed on the boundary between the first metal layer 11 and the second metal layer 13. A guide member may be disposed around the top surfaces of the metal layer 11 and 13.

<Sixth Embodiment>

Figure 28:
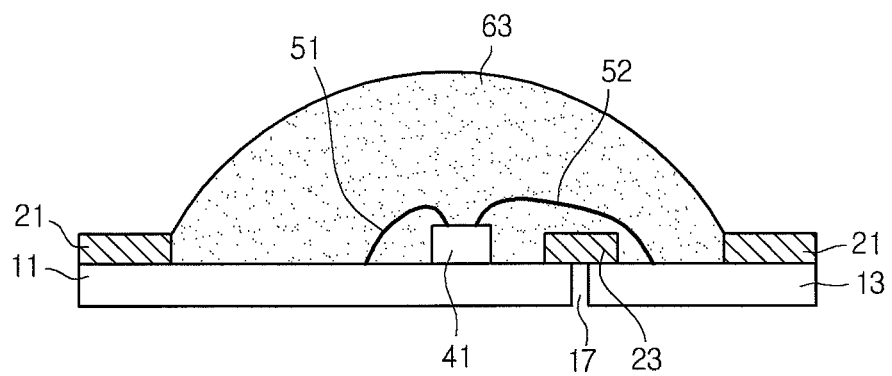
FIGS. 28 to 51 are views illustrating modified examples of a light emitting device according to another embodiment.

Referring to FIG. 28, a first insulation film 21 is disposed around top surfaces of a first metal layer 11 and a second metal layer 13. Also, a second insulation film 23 covering a portion between the first metal layer 11 and the second metal layer 13 is disposed. The first insulation film 21 and the second insulation film 23 may be connected to each other. An opened area may be disposed between the first insulation film 21 and the second insulation film 23.

A resin layer 63 is disposed on the opened area of the first insulation film 21 to cover a light emitting chip 41. A liquid resin-based insulation material may be dispensed and then cured to form the resin layer 63. Here, the first insulation film 21 may serve as a dam around the resin layer 63. The resin layer 63 may have a surface having a convex lens shape. A center part of the resin layer 63 may have a thickness greater than those of the first insulation film 21 and the second insulation film 23.

A guide member 31 or a reflective material may be further disposed around the resin layer 63, but is not limited thereto.

<Seventh Embodiment>

Figure 29:
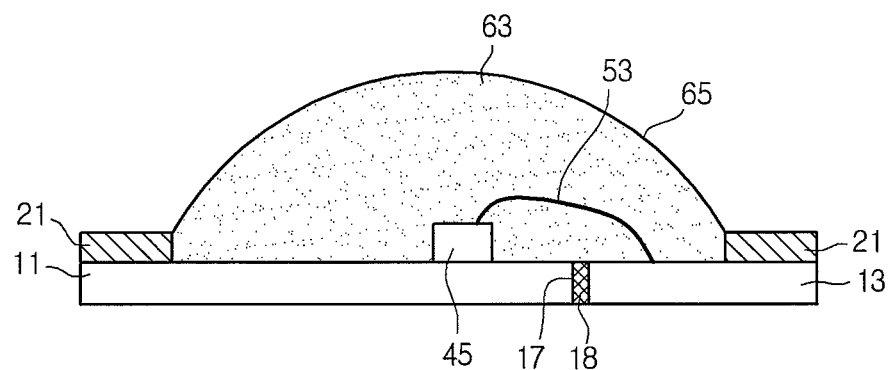

Referring to FIG. 29, a light emitting chip 45 is die-bonded to a first metal layer 11 and is connected to a second metal layer 13 through a wire. A resin layer 63 is disposed on the first metal layer 11 and the second metal layer 13.

The resin layer 63 is disposed on top surfaces of the metal layers 11 and 13. An insulation film 21 is disposed around the resin layer 63. The resin layer 63 may have a convex lens shape. A guide member 31 or a reflective material may be further disposed around the resin layer 63, but is not limited thereto.

A spacer 18 is disposed on a separation part 17 between the first metal layer 11 and the second metal layer 13. The spacer 18 is disposed between the first metal layer 11 and the second metal layer 13 and is formed of an insulation material. The spacer 18 adheres between the first metal layer 11 and the second metal layer 13. The spacer 18 may space the first metal layer 11 from the second metal layer 13 to prevent the first and second metal layers 11 and 13 from being electrically short-circuited with each other. The spacer 18 may be formed of at least one of $SiO_2$, $SiO_x$, $SiO_xN_y$, $Si_3N_4$, $Al_2O_3$, and $TiO_2$.

The resin layer 63 may have a lower surface contacting top sides of the first metal layer 11 and the second metal layer 13 and the a top surface of the spacer 18.

<Eighth Embodiment>

Figure 30:
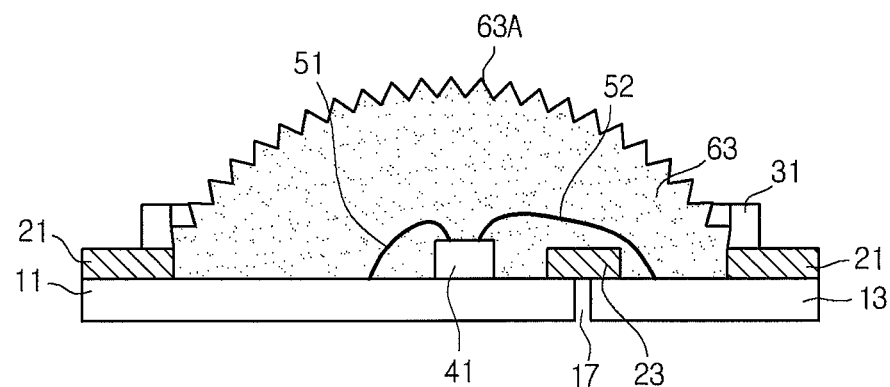

Referring to FIG. 30, a roughness 63A is disposed on a surface of a resin layer 63. The roughness 63A may have a rough surface by performing an etching or injecting process on the surface of the resin layer 61. The roughness 63A may change a critical angle of light traveling to the outside of the resin layer 63 to improve light extraction efficiency.

<Ninth Embodiment>

Figure 31:
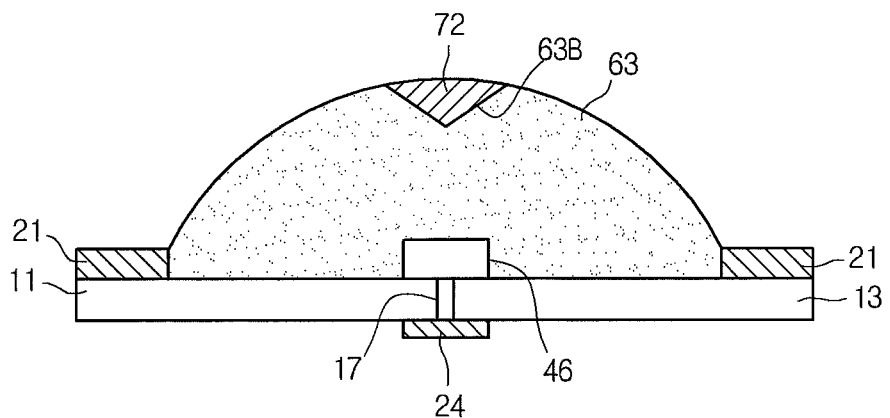

Referring to FIG. 31, a light emitting chip 41 may be mounted on a first metal layer 11 and a second metal layer 13 in a flip manner. The light emitting chip 41 is mounted on the first metal layer 11 and the second metal layer 13. The first metal layer 11 and the second metal layer 13 may have the same width as each other.

A second insulation film 24 is attached to lower surfaces of the first metal layer 11 and the second metal layer 13 to insulate the two metal layers 11 and 13 from each other and support the two metal layers 11 and 13.

A first insulation film 21 may be attached around top surfaces of the first metal layer 11 and the second metal layer 13 to fix the two metal layers 11 and 13.

The second insulation film 21 may serve as a dam to prevent the resin layer 63 from overflowing. A portion of the resin layer 63 may be filled between the first and second metal layers 11 and 13 to maintain an interval between the second insulation film 21 and the metal layers 11 and 13.

The resin layer 63 may have a convex hemispherical shape. Also, a concave part 63B having a predetermined depth is defined in a center of the resin layer 63. The concave part 63B may have a horn shape or a hemispherical shape. A reflective material 72 may be disposed within the concave part 63B. The reflective material 72 may include a metal oxide. For example, the reflective material 72 may form at least one layer formed of a material such as $TiO_2$, or/and $SiO_2$ to reflect incident light into a side direction. The resin layer 63 and the reflective material 72 may have refractive indexes different from each other. For example, the reflective material 72 may have a refractive index greater than that of the resin layer 63. The resin layer 63 may reflect light of a center direction toward the side direction to uniformly provide orientation angle distribution of the light.

Also, a scattering agent, but the reflective material may be disposed in the concave part 63B, but is not limited thereto.

<Tenth Embodiment>

Figure 32:
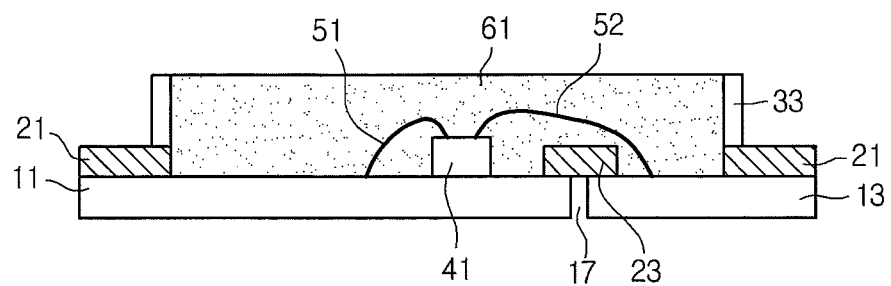

Referring to FIG. 32, a guide member 33 is formed on a side surface of the resin layer 61. After the resin layer 61 is formed, the guide member 33 may be deposited by performing a sputtering or deposition method on at least two side surfaces of the resin layer 61. Thus, a manufacturing process may be changed due to the guide member 33. A width and thickness of the guide member 33 may be adjusted according to a deposition time. The guide member 33 may be formed of a reflective material such as Al or Ag or a light transmitting material having a high refractive index.

<Eleventh Embodiment>

Figure 33:
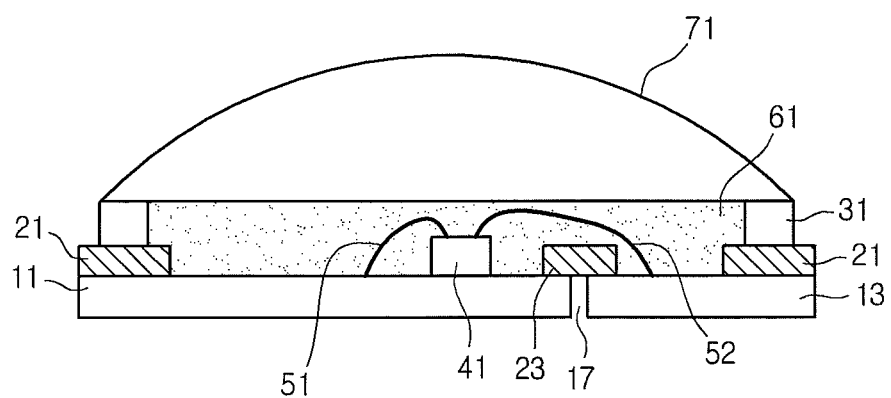

Referring to FIG. 33, a light emitting device has a structure in which a lens 71 is disposed on a resin layer 61. A lens 71 on the resin layer 61 may have a convex hemispherical shape and may adhere to top surfaces of the resin layer 61 and a guide member 31. The guide member 31 and the lens 71 may have uneven surfaces, respectively, but are not limited thereto.

<Twelfth Embodiment>

Figure 34:
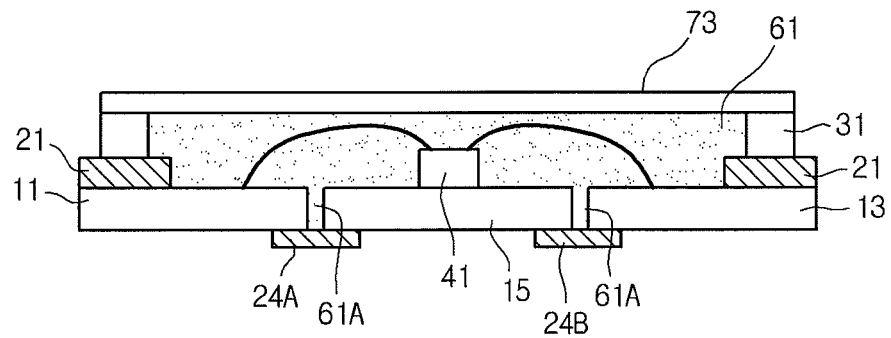

Referring to FIG. 34, a light emitting device includes three metal layers 11, 13, and 15 arranged with each other. The first and second metal layers 11 and 13 of the three metal layers 11, 13, and 15 may used as electrodes. The third metal layer 15 may be disposed between the first and second metal layers 11 and 13 and used as a heatsink plate.

A first insulation film 21 is disposed around top surfaces of the first to third metal layers 11, 13, and 15 to serve as a barrier of the resin layer 61 and support the metal layers 11, 13, and 15. Second and third insulation films 24A and 24B may adhere to lower portions between the first and third metal layers 11 and 15 and between the second and third metal layers 13 and 15 to support portions between the first and third metal layers 11 and 15 and between the second and third metal layers 13 and 15. The second and third insulation films 24A and 24B may prevent the metal layers adjacent to each other from being short-circuited with each other. The second and third insulation films 24A and 24B may be disposed as a single film or a separated film on areas different from each other.

Also, a portion 61A of the resin layer 61 is filled between the first and third metal layers 11 and 15 and between the second and third metal layers 13 and 15 to adhere to the side surfaces of metal layers adjacent to each other. Here, the second and third insulation films 24A and 24B may be removed after the resin layer 61 is cured. The metal layers 11, 13, and 15 may be supported by the resin layer 61 and the first insulation film 21 and have a flat lower surface.

A phosphor layer 73 is disposed above the resin layer 61. The phosphor layer 73 may be a film including a phosphor or a resin layer to which a phosphor is added. The phosphor layer 73 may extend from a top surface of the resin layer 61 up to a top side of the guide member 31. The phosphor layer 73 may absorb a part of light emitted from the light emitting chip 41 to emit light having a wavelength longer than that of the absorbed light, thereby moving in desired color coordinates in a color coordinate distribution.

<Thirteenth Embodiment>

Figure 35:
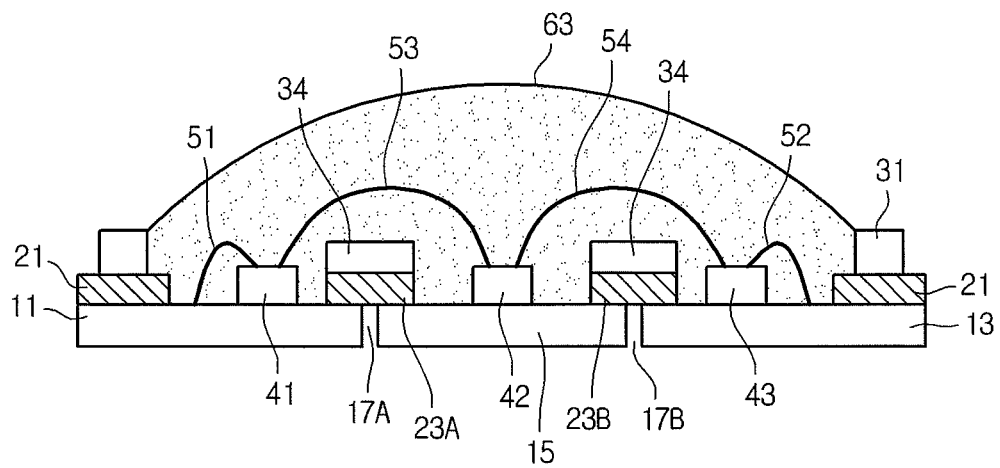

Referring to FIG. 35, a light emitting device has a structure in which a second guide member 35 is further disposed on second and third insulation films 23A and 23B.

The second and third insulation films 23A and 23B may cover separation parts 17A and 17B between adjacent metal layers 11, 13, and 15 to adhere to top surfaces of boundaries of the metal layers 11, 13, and 15. Then, a second guide member 34 is disposed on the second insulation films 23A and 23B. A first guide member 31 is disposed on the first insulation film 21. Light emitting chips 41, 42, and 43 are disposed on opened areas of the first guide member 31 and the second guide member 34. The first guide member 31 and the second guide member 34 may be disposed around the light emitting chips 41, 42, and 43 to effectively reflect incident light.

The first light emitting chip 41 is disposed on the first metal layer 11, the second light emitting chip 42 is disposed on the third metal layer 15, and the third light emitting chip 43 is disposed on the second metal layer 13. The first light emitting chip 41 is connected to the first metal layer 11 and a first electrode of the second light emitting chip 42 through wires 51 and 53. A second electrode of the second light emitting chip 42 is connected to a first electrode of the third light emitting chip 43 through a wire 54. A second electrode of the third light emitting chip 43 is connected to the second metal layer 13 through a wire 52. The second light emitting chip 42 is directly connected to other light emitting chips, but is not limited thereto.

The first light emitting chip 41 may be connected to the first metal layer 11 through the wires 51 and 52. The first light emitting chip 41 and the second light emitting chip 42 may be correspondingly connected to each other in chip-to-chip through the wires 51 and 52. The second light emitting chip 42 may be connected to the third metal layer through the wires 51 and 52.

<Fourteenth Embodiment>

Figure 36:
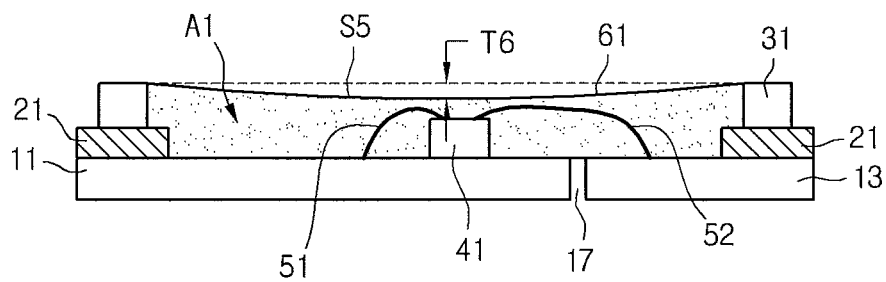

Referring to FIG. 36, a light emitting device includes a resin layer 61 having a concave surface S5. For example, the resin layer 61 may have a lens shape in which a side part is high and a center part is low. A gap T6 between the side part and the center part of the resin layer 61 may be about 0.001 mm to about 1 mm. This gap T6 may prevent an optical guide plate from contacting. Thus, abnormal color distribution such as a chromatic blur phenomenon due to the contact of the optical guide plate may be prevented.

<Fifteenth Embodiment>

Figure 37:
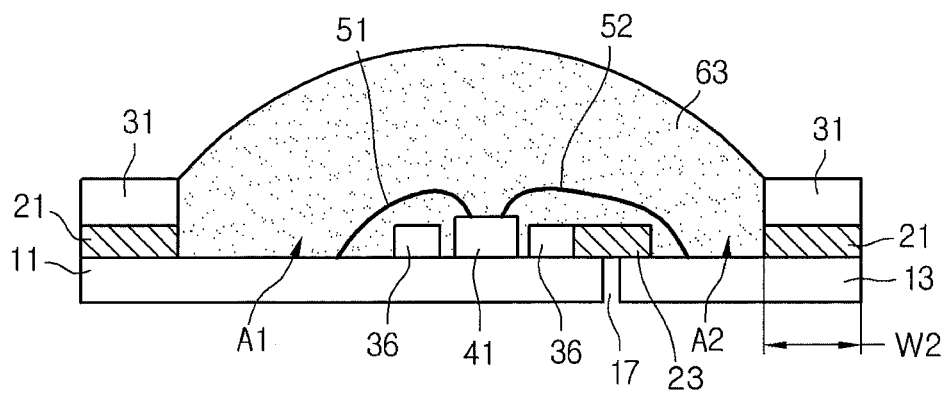

Referring to FIG. 37, a first guide member 31 may be disposed on a first insulation film 21 and a second guide member 36 may be disposed around a light emitting chip 41. The second guide member 36 may be disposed around the light emitting chip 41. The second guide member 36 may have a thickness thicker or less than that of the light emitting chip 41. A portion of the second guide member 36 is disposed between the light emitting chip 41 and the second insulation film 23. Another portion of the second guide member 36 may be disposed between the light emitting chip 41 and a first wire 51.

The second guide member 36 may have a frame shape, a loop shape, or a ring shape. The second guide member 36 may be disposed within a first opened area A1 of the first metal layer 11 to effectively reflect light emitted from the light emitting chip 41.

The first guide member 31 may have the same width as the first insulation film 21. Thus, after the first guide member 31 adheres to the first insulation film 21, a process such as punching may be performed.

According to the current embodiment, the guide members 31 and 36 may be doubly disposed around the light emitting chip 41 to improve light reflection efficiency and orientation angle distribution.

<Sixteenth Embodiment>

Figure 38:
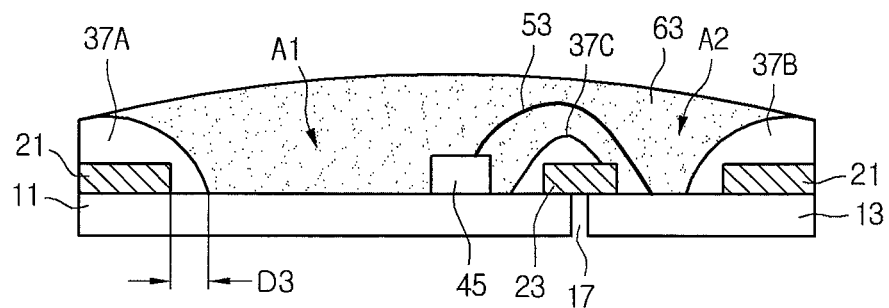

Referring to FIG. 38, a light emitting device includes first and third guide member 37A and 37B on a first insulation film 21. The first guide member 37A may be disposed on top and inner surfaces of the first insulation film 21. A portion of the first guide member 37A is disposed closer to the light emitting chip 45 than to the first insulation film 21. A lower portion of the first guide member 37A may contact the top surface of the first metal layer 11. The third guide member 37B may be disposed on the top and inner surfaces of the first insulation film 21. A portion of the third guide member 37B is disposed closer to the light emitting chip 45 than to the first insulation film 21. A lower portion of the third guide member 37B may contact the top surface of the second metal layer 13. The first guide member 37A may extend up to top surfaces of the metal layers 11 and 13 by a predetermined interval D3. The interval D3 may be about 0.1 mm or more.

The first and third guide members 37A and 37B may be connected to each other when each of the first and third guide members 37A and 37B is formed of a non-metallic material or an insulation resin material.

When each of the first and third guide members 37A and 37B are formed of a conductive material, the first and third guide members 37A and 37B may be physically separated from each other. Thus, the first and third guide members 37A and 37B may be spaced from each other on a boundary between the first metal layer 11 and the second metal layer 13. Accordingly, the first guide member 37A contacting the top surface of the first metal layer 11 and the third guide member 37B contacting the top surface of the second metal layer 13 may be separated from each other to prevent the first and third guide members 37A and 37B from being electrically short-circuited.

Also, the second guide member 37C may be disposed on top and inner surfaces of the second insulation film 23 to contact the top surface of the first metal layer 11. The second guide member 37C may be connected to the first guide member 37A and may be separated from the third guide member 37B. The second guide member 37C may be physically spaced from the second metal layer 13.

The first guide member 37A and the second guide member 37C may be disposed corresponding to a surrounding of the light emitting chip 45 to effectively reflect the light emitted from the light emitting chip 34. Each of the first guide member 37A and the second guide member 37C may be formed of a resin material, a non-metallic material, or a reflective metal.

Also, the inner surfaces of the first guide member 37A and the second guide member 37C correspond to the light emitting chip 45 and may have a curved or inclined shape with respect to the top side of the first metal layer 11.

The first to third guide members 37A, 37C, and 37B may be formed of the same material as or materials different from each other, but is not limited thereto. The first to third guide members 37A, 37C, and 37B may be formed of a metal material or an insulation material as another example.

<Seventeenth Embodiment>

Figure 39:
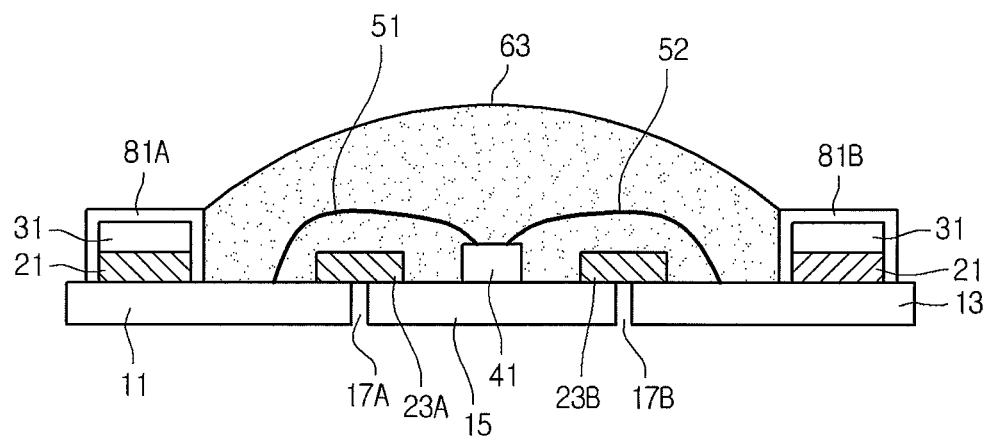

Referring to FIG. 39, a light emitting device further includes reflective layers 81A and 81B on a guide member 31.

The reflective layers 81A and 81B may be formed of a high reflective metal such as Ag and Al having a reflectance of about 70% or more. The high reflective metal may be formed through plating or coating process. The reflective layers 81A and 81B may be formed on top and side surfaces of the guide member 31 and the first insulation film 21. The reflective layers 81A and 81B may be discontinuously disposed and spaced from each other to prevent the first and second metal layers from being electrically short-circuited with each other.

According to the above-mentioned embodiments, since the insulation films 21, 23A, and 23B adhere to the surroundings of the top surfaces of the metal layers 11 and 13, the side surfaces of the metal layers may be spaced about 1 μm or more from the insulation film 21, but is not limited thereto.

<Eighteenth Embodiment>

Figure 40:
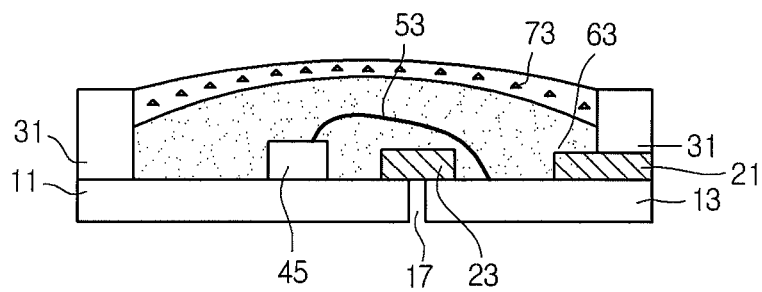

Referring to FIG. 40, in a light emitting device, a light emitting chip 45 is bonded to a first metal layer 11 and a second metal layer 13 is connected to the light emitting chip 45 through a wire 53. A second insulation film 23 may be attached on a top surface between the first metal layer 11 and the second metal layer 13.

A guide member 31 is disposed on the first metal layer 11 and the first insulation film 21 in a continuous or discontinuous shape. For example, the guide member 31 may have a frame shape, a loop shape, and a ring shape.

A resin layer 63 may be disposed within the guide member 31 and a phosphor layer 73 may be disposed on the resin layer 63. A phosphor of the phosphor layer 73 may be dispersed in an entire area. Also, since the phosphor is spaced from the light emitting chip 45, discoloration may be prevented.

<Nineteenth Embodiment>

Figure 41:
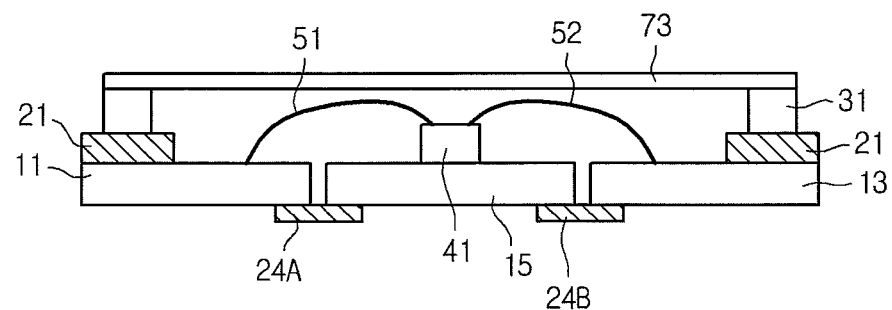

Referring to FIG. 41, in a light emitting device, a resin layer is removed and a photo luminescent film 74 is disposed on a light emitting chip 41. The photo luminescent film 74 is disposed spaced from the metal layers 11, 13, and 15 and is supported by the guide member 31.

Second insulation films 24A and 24B may be disposed on a top or lower surface between the metal layers 11, 13, and 15, but is not limited thereto.

<Twentieth Embodiment>

Figure 42:
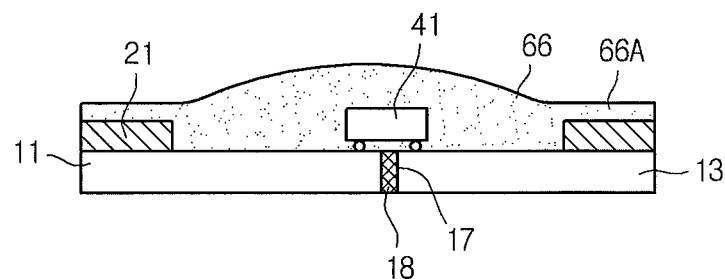
Figure 43:
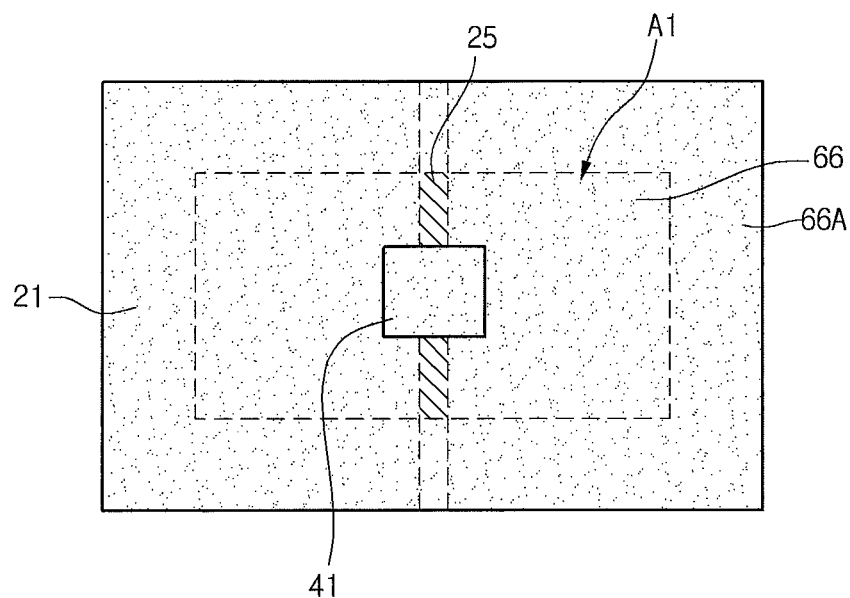

FIG. 42 is a side sectional view of a light emitting device, and FIG. 43 is a plane view of FIG. 43.

Referring to FIGS. 42 and 43, a light emitting chip 41 is mounted on a first metal layer 11 and a second metal layer 13 in a flip manner. An insulation film 21 is disposed around the first metal layer 11 and the second metal layer 13. A spacer 18 formed of an insulation material may be disposed between the first metal layer 11 and the second metal layer 13.

The spacer 18 prevents a resin layer from leaking.

The resin layer 66 may be disposed around the light emitting chip 41. A portion of the resin layer 66 may extend up to a top surface of the insulation film 21.

<Twenty First Embodiment>

Figure 44:
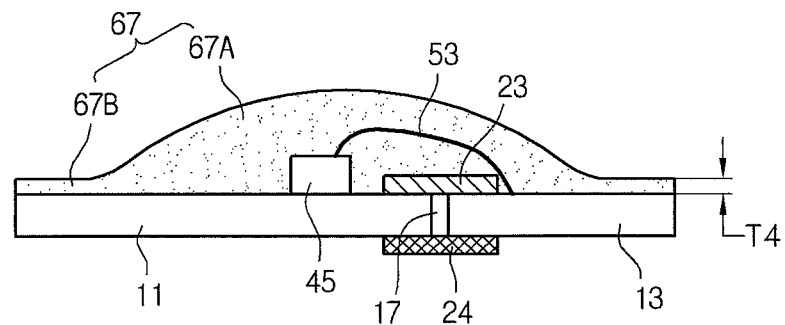

Referring to FIG. 44, in a light emitting device, insulation films 23 and 24 are attached on top and lower surfaces between a first metal layer 11 and a second metal layer 13. A light emitting chip 45 is disposed on the first metal layer 11 and a resin layer 67 is molded to the light emitting chip 45.

The resin layer 67 may have the same side surface as those of the first metal layer 11 and the second metal layer 13. The resin layer 67 may have a width corresponding to an interval between both side surfaces of the first and second metal layers 11 and 13.

Here, the resin layer 67 may have the thickest thickness at a center part 67A. Also, the thickness T4 of the resin layer 67 may gradually decrease from the center part 67A toward the outside. The center part 67A has a convex lens shape. The thickness T4 may be greater or less than a height of the light emitting chip 45. This resin layer 67 may be manufactured using an injection molding frame. Also, since the light emitting device is cut and separated by a size unit of each light emitting device after the resin layer 67 is cured. Therefore, the light emitting chip 45 may be mounted on or the resin layer 67 may be disposed on the metal layers 11 and 13 during the manufacturing processes. A separation part 17 between the metal layers 11 and 13 may be formed through a laser or cutting process after the final resin layer is formed, but is not limited thereto.

<Twenty Second Embodiment>

Figure 45:
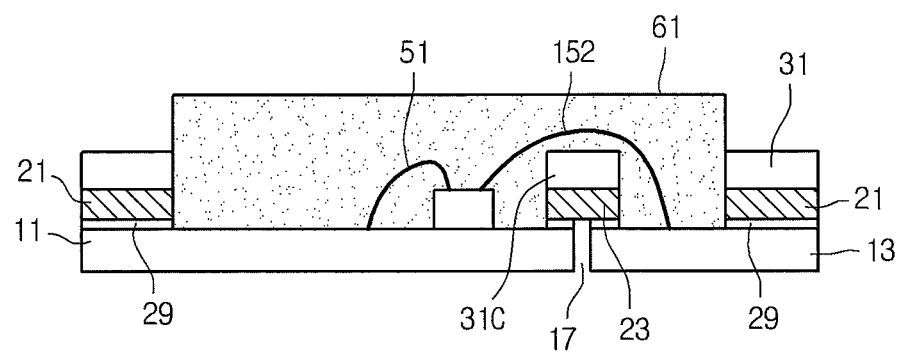

Referring to FIG. 45, in a light emitting device, an adhesion layer 29 is disposed between insulation films 21 and 23 and metal layers 11 and 13. The adhesion layer 29 may use an insulation adhesive such as silicon or epoxy. The adhesion layer 29 may have a thickness of about 12 μm or more.

Also, a top surface of the resin layer 61 may be higher than that of a first guide member 31 or a second guide member 31C.

The second guide member 31C may be disposed on the insulation film 21 to efficiently reflect light emitted from the light emitting chip 41.

<Twenty Third Embodiment>

Figure 46:
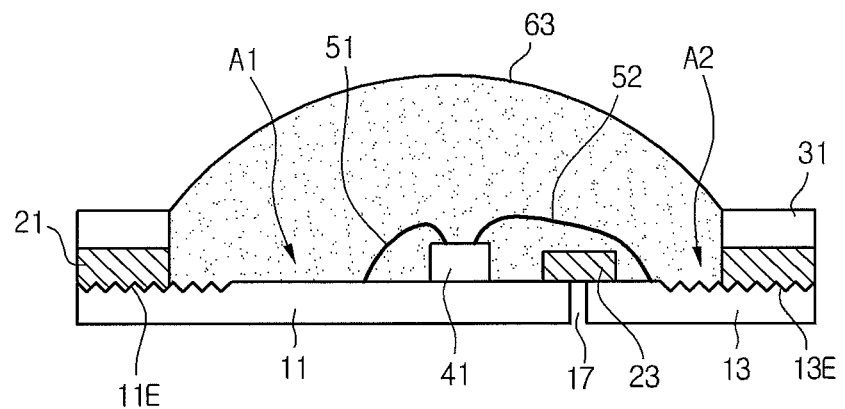

Referring to FIG. 46, top surfaces of the metal layers 11 and 13 have uneven structures 11E and 13E. The uneven structures 11E and 13E may be disposed under a first insulation film 21 and may extend up to opened areas A1 and A2 of each of the metal layers 11 and 13.

The uneven structures 11E and 13E may improve a contact area between the insulation films 21 and 23 on the metal layers 11 and 13 or heat radiation efficiency.

<Twenty Fourth Embodiment>

Figure 47:
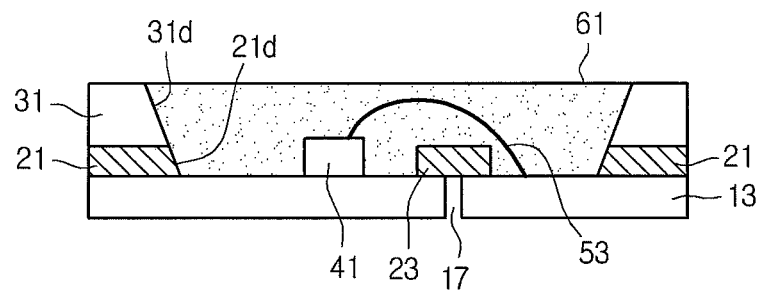

Referring to FIG. 47, at least one of inner surfaces of an insulation film and a guide member 31 may have inclined planes 21d and 31d. The inclined planes 21d and 31d may be disposed from the inner surface of the first insulation film 21 to the inner surface of the guide member 31. The inclined planes 21d and 31d may be disposed on one or both of the side surfaces of the first insulation film 21 and the guide member 31.

Each of the inclined planes 21d and 31d may have a tilting angle of about 15° to about 89° with respect to the top surfaces of the metal layers 11 and 13. These inclined planes 21d and 31d may efficiently reflect light in a light emission direction. Also, a reflective material may be coated on the inclined planes 21d and 31d. The reflective material may be a non-conductive material. Alternatively, the reflective material may be disposed on an insulation material such as the adhesion layer to prevent the metal layers from being electrically short-circuited.

The resin layer 61 may have a flat top surface. The resin layer 61 may have an upper width wider than a lower width thereof due to the inclined planes 21d and 31d.

Also, the inner surface of the second insulation film 23, i.e., a surface corresponding to the light emitting chip 45 may be inclined, but is not limited thereto. Also, a second guide member may be disposed on the second insulation film 23. The second guide member may have an inclined inner surface.

<Twenty Fifth Embodiment>

FIG. 49A is a side sectional view of a light emitting device. FIG. 49B is a plan view of a case in which an insulation film is disposed on a metal layer of FIG. 49A.

Figure 48:
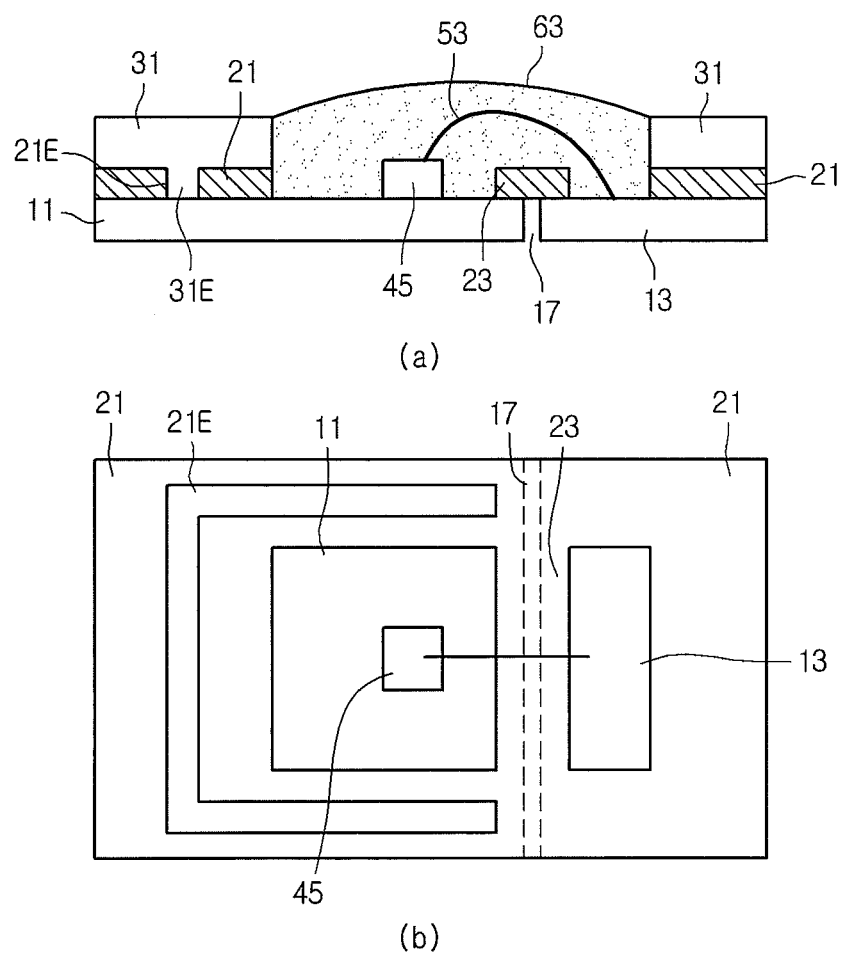

Referring to FIG. 48, a hole 21E is defined in a first insulation film 21 on a first metal layer 11. The hole 21E exposes a top surface of the first metal layer 11. A guide member 31 may be formed on the first and second insulation films 21 and 23. A portion 31E of the guide member 31 may contact the first metal layer 11 through the hole 21E. A portion of the guide member 31 has a protrusion shape. The guide member 31 has a width less than that of the first insulation film 21.

A portion 31E of the guide member 31 may reflect incident light when the first insulation film 21 is formed of a light transmitting material. Also, when the guide member 31 and the first metal layer are formed of a metal, the guide member 31 and the first metal layer 11 may adhere to each other to fix the first insulation film 21.

Here, when the guide member 31 is formed of a non-metallic material or a resin series having non-conductivity, a through hole 21E of the first insulation film 21 may be defined in each of the first metal layer 11 and the second metal layer 13, except the top surface of the boundary between two metal layers 11 and 13. The hole 21E may be provided in plurality in the first insulation film 21.

<Twenty Sixth Embodiment>

Figure 49:
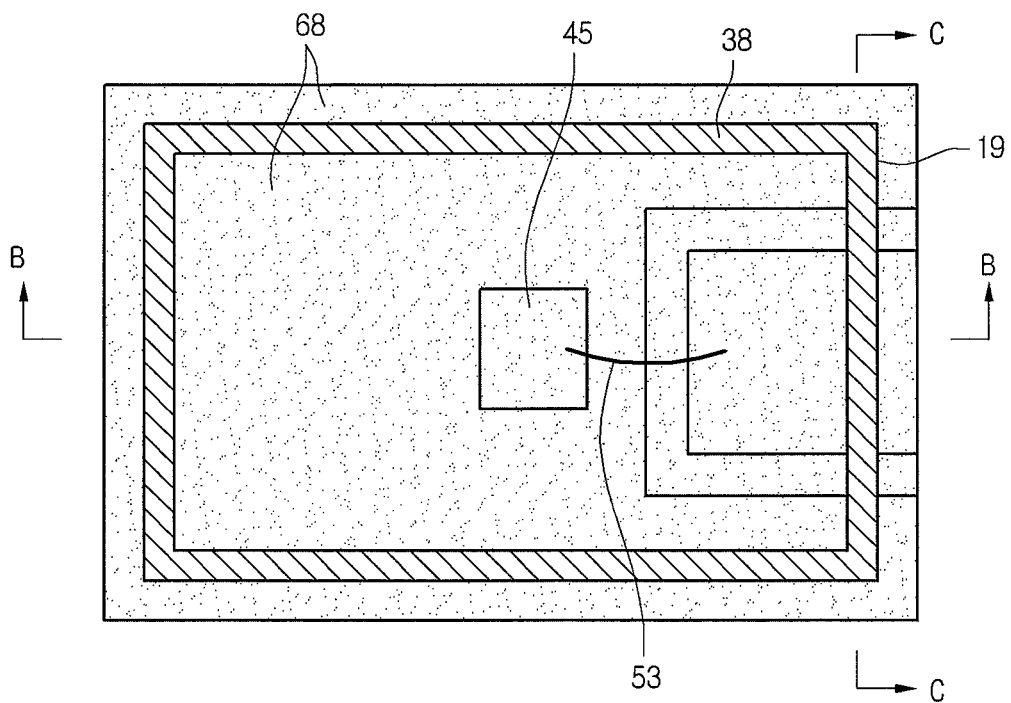
Figure 50:
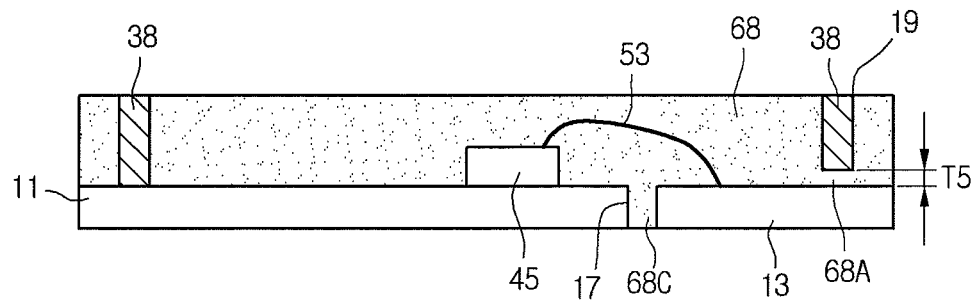
Figure 55:
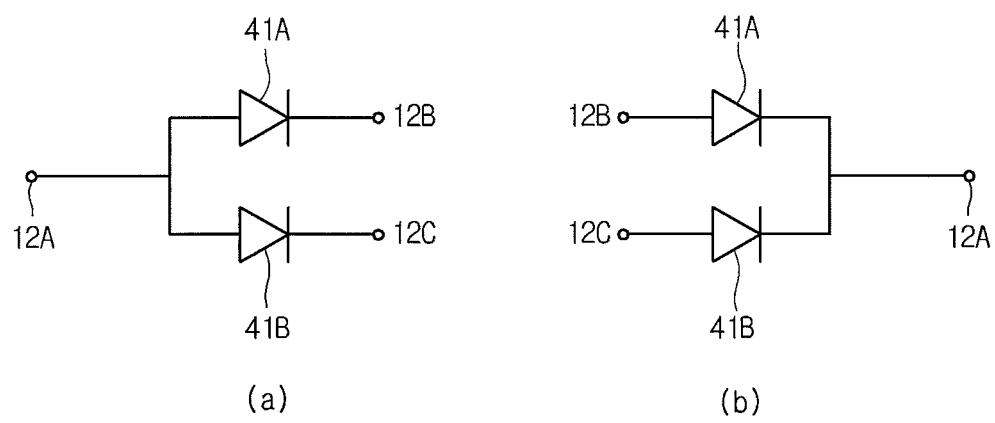

FIG. 49 is a plan view according to an embodiment. FIG. 50 is a sectional view taken along line B-B of FIG. 49. FIG. 55 is a sectional view taken along line C-C of FIG. 51.

Figure 51:
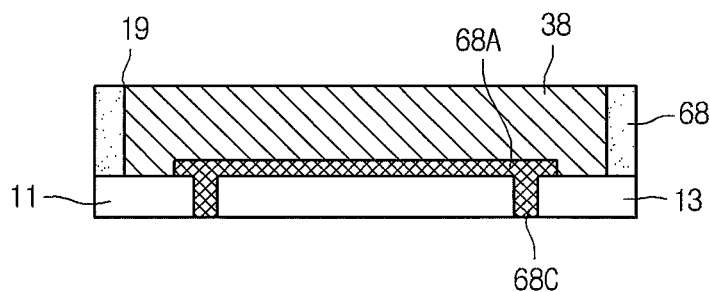

Referring to FIGS. 49 to 51, a resin layer 68 is disposed on an entire top surface of first and second metal layers 11 and 13 to mold a light emitting chip 45. A groove 19 is defined around the resin layer 68. The groove 19 may have a ring shape, a frame shape, or a polygonal shape. A top surface of the first metal layer 11 may be exposed through the groove 19 and may be spaced from the second metal layer 13. The etching process may include a wet or dry etching process, but is not limited thereto.

A guide member 38 may be disposed in the groove 19 and may be formed of a reflective material. The guide member 38 may be disposed around the light emitting chip 45 in a circular or polygonal ring shape. The guide member 38 may contact the first metal layer 11 and be spaced a predetermined interval T5 from the second metal layer. Therefore, the guide member 38 may not contact a lower portion 68A of the resin layer 68. Here, the lower portion 68A may be a resin layer or an insulating adhesion layer.

When the guide member 38 is embedded within the resin layer 68, the guide member 38 may contact a top surface of the first metal layer 11 and be spaced from the second metal layer 13. Also, the guide member 38 may have heights which are different from each other at the first metal layer 11 and the second metal layer 13. The guide member 38 may reflect light emitted from the light emitting chip 45. Since this structure has a structure in which the insulation film is not separately attached, the manufacturing process may be simplified.

A portion 68C of the resin layer 68 may be filled in a separation part 17 between the first metal layer 11 and the second metal layer 13 or an insulation film may be attached to the top or/and lower surface(s) of the metal layers.

The guide member 38 may have an upper width wider than a lower width. Also, the guide member 38 may have an inner surface inclined at a predetermined angle with respect to the top surfaces of the metal layers 11 and 13.

Features of each embodiment may be selectively applied to other embodiments, are not limited to each embodiment.

Here, when the guide member 38 is formed of a non-metallic material or insulation resin series, the groove 19 of the resin layer 68 may extend to the top surfaces of the first and second metal layers 11 and 13 except a top surface of a boundary between the two metal layers 11 and 12. The guide member 38 is disposed in the groove 19.

Figure 52:
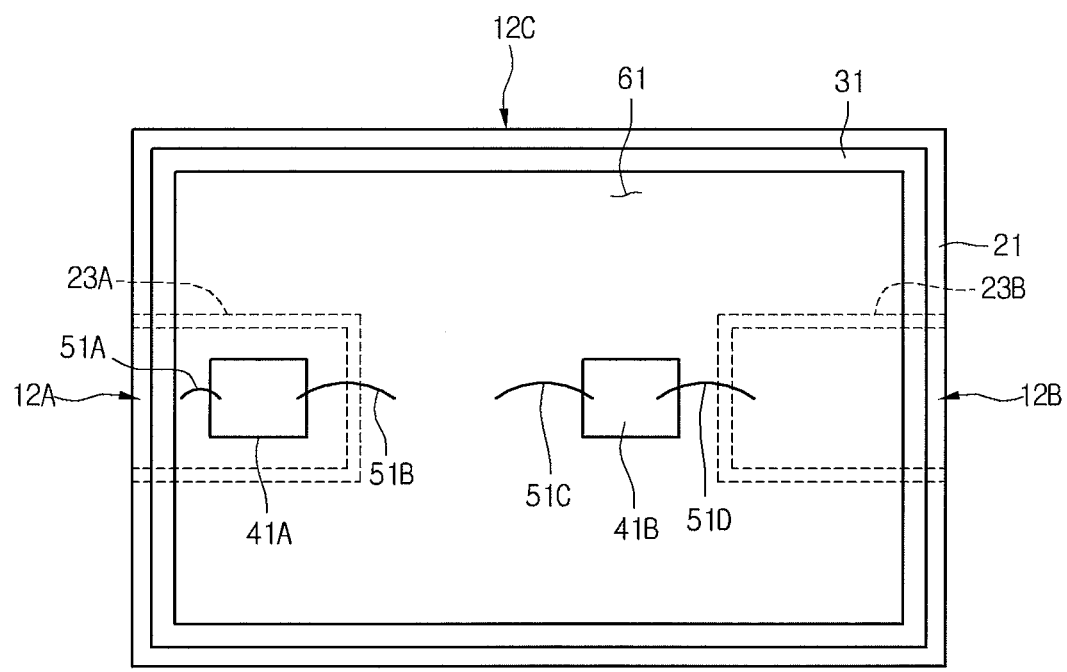
FIGS. 52 and 53 are a side sectional view and a circuit diagram illustrating another example of a light emitting device according to an embodiment.
Figure 53:
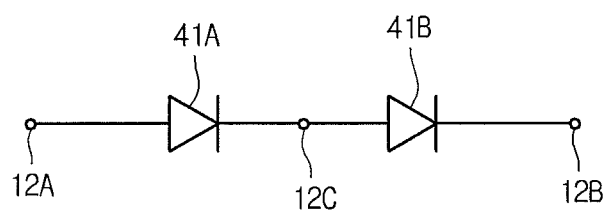

FIGS. 52 and 53 are a side sectional view and a circuit diagram of a light emitting device according to an embodiment.

Referring to FIG. 52, a light emitting device includes three or more metal layers 12A, 12B, and 12C and two or more light emitting chips 41A and 41B. The light emitting chips 41A and 41B may emit light having the same peak wavelength as or peak wavelengths different from each other.

The metal layers 12A, 12B, and 12C are arrayed on the same plane. A first insulation film 21 is disposed around the metal layers 12A, 12B, and 12C. Second insulation films 23A and 23B are respectively disposed between the metal layers 12A and 12B, and 12B and 12C adjacent to each other to support and fix the metal layers 12A and 12B, and 12B and 12C adjacent to each other.

The first light emitting chip 41A is disposed on the first metal layer 12A. The second light emitting chip 41B is spaced from the second metal layer 12B.

The second metal layer 12B may serve as common electrodes of the first light emitting chip 41A and the second light emitting chip 41B. The first metal layer 12A may serve as an electrode for controlling the first light emitting chip 41A, and the third metal layer 12C may serve as an electrode for controlling the second light emitting chip 41B.

When the first and second light emitting chips 41A and 41B are lateral type chips, the first light emitting chip 41A may be electrically connected to the first metal layer 12A and the second metal layer 12B through a first wire 51A and a second wire 51B, respectively. Also, the second light emitting chip 41B may be electrically connected to the second metal layer 12B and the third metal layer 12C through a third wire 51C and a fourth wire 51D, respectively.

When the first and second light emitting chips 41A and 41B are vertical type chips, the first and third wires 51A and 51C may be omitted.

A guide member 31 is disposed on the first insulation film 21. The guide member 31 is disposed at a position higher than those of the light emitting chips 41A and 41B to reflect light emitted from the light emitting chips 41A and 41B.

A resin layer 61 is disposed on the first and second light emitting chips 41A and 41B. A portion of the resin layer 61 may be disposed at the same height as or a height less than a top surface of the guide member 31, but are not limited thereto.

Referring to FIG. 53, the light emitting chips 41A and 41B may have a lateral electrode structure to realize a circuit in which the first metal layer 12A serves as an anode and the third metal layer 12B serves as a cathode. Referring to FIG.

14, unlike the circuit illustrated in FIG. 14, the first metal layer may serve as a cathode, and the third metal layer 12B may serve as an anode.

Figure 54:
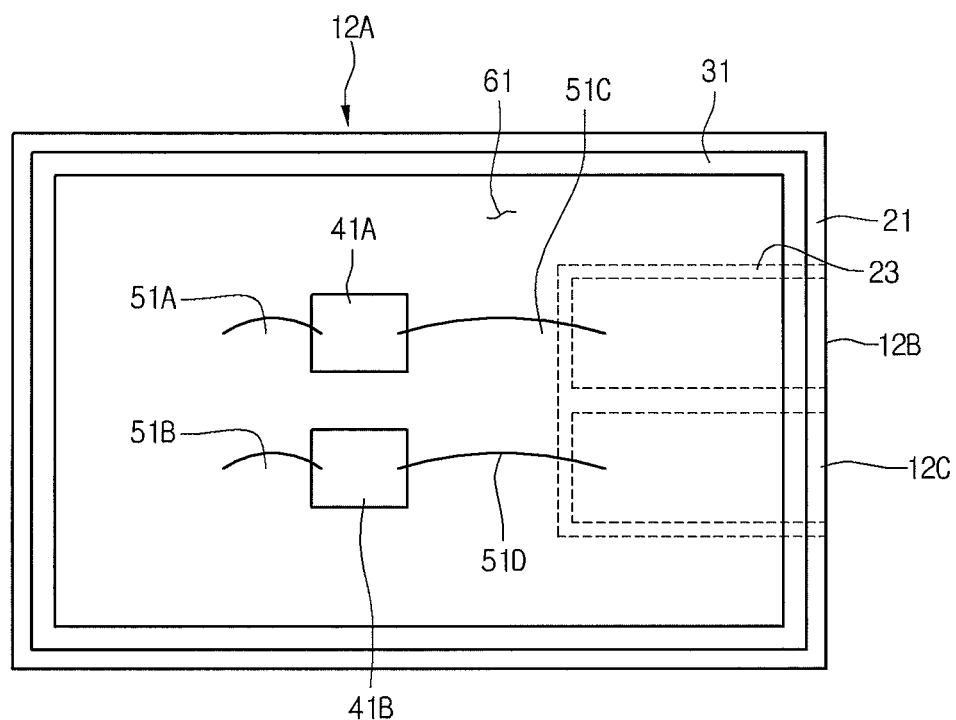
FIGS. 54 and 55 are a side sectional view and a circuit diagram illustrating another example of a light emitting device according to an embodiment.

FIGS. 54 and 55 are a side sectional view and a circuit diagram of a light emitting device according to an embodiment.

Referring to FIG. 54, a light emitting device includes three or more metal layers 12A, 12B, and 12C and two or more light emitting chips 41A and 41B. The light emitting chips 41A and 41B may emit light having the same peak wavelength as or peak wavelengths different from each other.

The metal layers 12A, 12B, and 12C are arrayed on the same plane. A first insulation film 21 is disposed around the metal layers 12A, 12B, and 12C. A second insulation film 23 is disposed between the metal layers 12A and 12B, 12A and 12C, and 12B and 12C adjacent to each other to support and fix the metal layers 12A and 12B, 12A and 12C, and 12B and 12C adjacent to each other.

The first light emitting chip 41A and the second light emitting chip 41B, which are spaced from each other, are disposed on the first metal layer 12A.

The first metal layer 12A may serve as common electrodes of the first light emitting chip 41A and the second light emitting chip 41B. The second metal layer 12B may serve as an electrode for controlling the first light emitting chip 41A, and the third metal layer 12C may serve as an electrode for controlling the second light emitting chip 41B.

When the first and second light emitting chips 41A and 41B are lateral type chips, the first light emitting chip 41A may be electrically connected to the first metal layer 12A and the second metal layer 12B through a first wire 51A and a third wire 51C, respectively. Also, the second light emitting chip 41B may be electrically connected to the first metal layer 12A and the third metal layer 12C through a second wire 51B and a fourth wire 51D, respectively.

When the first and second light emitting chips 41A and 41B are vertical type chips, the first and second wires 51A and 51B may be omitted.

A guide member 31 is disposed on the first insulation film 21. The guide member 31 is disposed at a position higher than those of the light emitting chips 41A and 41B to reflect light emitted from the light emitting chips 41A and 41B.

A resin layer 61 is disposed on the first and second light emitting chips 41A and 41B. A portion of the resin layer 61 may be disposed at the same height as or a height less than a top surface of the guide member 31, but are not limited thereto.

Referring to FIG. 55A, the light emitting chips 41A and 41B may have a lateral electrode structure to realize a circuit in which the first metal layer 12A serves as a positive common electrode and the second and third metal layers 12B 12C serve as cathodes. On the other hand, referring to FIG. 55B, the first metal layer 12A may serve as a negative common electrode, and the second and third metal layers 12B and 12C may serve as anodes.

Figure 56:
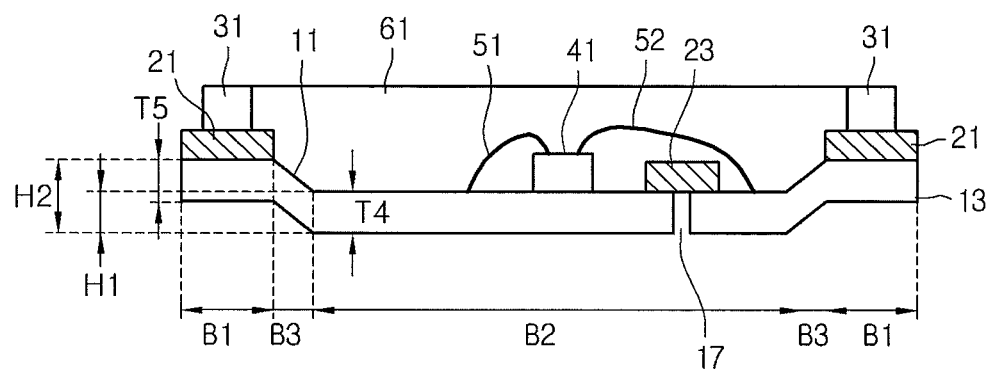
FIG. 56 is a side sectional view illustrating a modified example of a metal layer of a light emitting device according to an embodiment.

FIG. 56 is a side sectional view illustrating a modified example of a light emitting device according to a first embodiment.

Referring to FIG. 56, a light emitting device 100 includes a plurality of metal layers 11 and 13, insulation films 21 and 23 on the metal layers 11 and 13, a light emitting chip 41 on at least metal layer 11 of the plurality of metal layers 11 and 13, a guide member 31 on the insulation film 21, and a resin layer 61 covering the light emitting chip 41 on the metal layers 11 and 13.

Since the metal layers 11 and 13 are not provided as separate bodies, e.g., do not have a structure in which the metal layers 11 and 13 are fixed using a resin-based body formed of polyphthalamide (PPA), a portion of the metal layers 11 and 13 may have a flexibly curved shape, be bent at a predetermined angle, or be partially etched.

That is, each of the metal layers 11 and 13 include an outer part B1, an inner part B2, and an inclined part B3. A height H2 of a top surface of the outer part B1 of each of the metal layers 11 and 13 may be greater than that H1 of a top surface of the inner part B2 of each of the metal layers 11 and 13.

Here, the outer part B1 of the metal layer 11 or 13 may have a thickness T5 equal to that T4 of the inner part B2 of the metal layer 11 or 13.

The metal layers 11 and 13 include the inner part B2 and the outer part B 1. The outer part B1 may be disposed at a position higher than that of a top surface of the inner part B2. Each of the metal layers 11 and 13 may be bent to form the outer part of each of the metal layers 11 and 13. In the bending process, the inclined part B3 having an inclined surface may be disposed between the inner part B2 and the outer part B1 of the metal layers 11 and 13.

The inclined part B3 of the plurality of metal layers 11 and 13 may have opposite surfaces facing each other. Here, the opposite surfaces may face each other in a state where they are inclined. The inclined part B3 may be an inclined angle of about 15° to about 89° with respect to the top surface of the inner part B2 of the metal layers 11 and 13. The inclined surface of the inclined part B3 may effectively reflect light in a light emission direction.

Also, the light emitting chip 41 and the second insulation film 23 may be disposed on the inner part B2 of the metal layers 11 and 13.

Also, the first insulation film 21 may be disposed on the outer part B1 of the metal layers 11 and 13. The guide member 31 may be disposed on the firs insulation film 21.

Although not shown, an inner surface of at least one of the first insulation film 21 disposed on the outer part B1 and the guide member 31 may be inclined at the inclined angle of the inclined part B3 of the metal layers 11 and 13.

Figure 57:
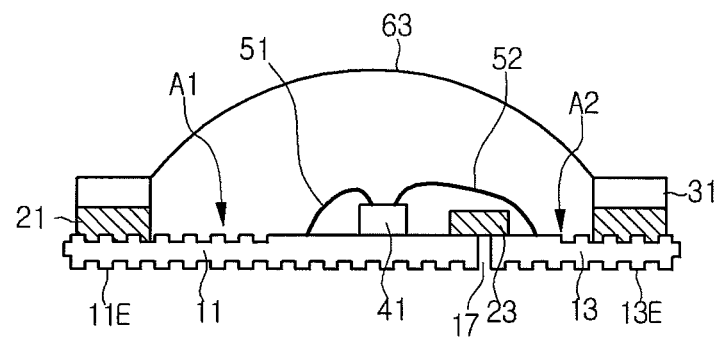
FIGS. 57 to 59 are views illustrating modified examples of a metal layer of a light emitting device according to an embodiment.
Figure 58:
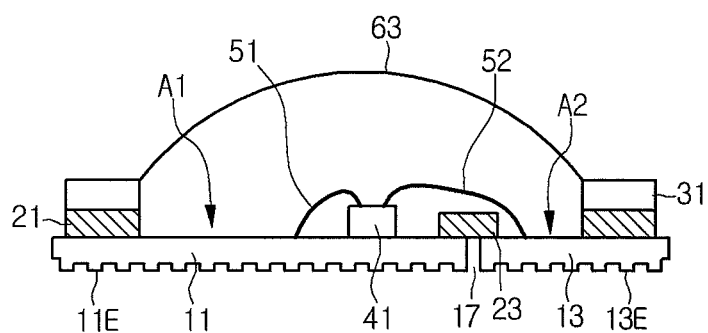
Figure 59:
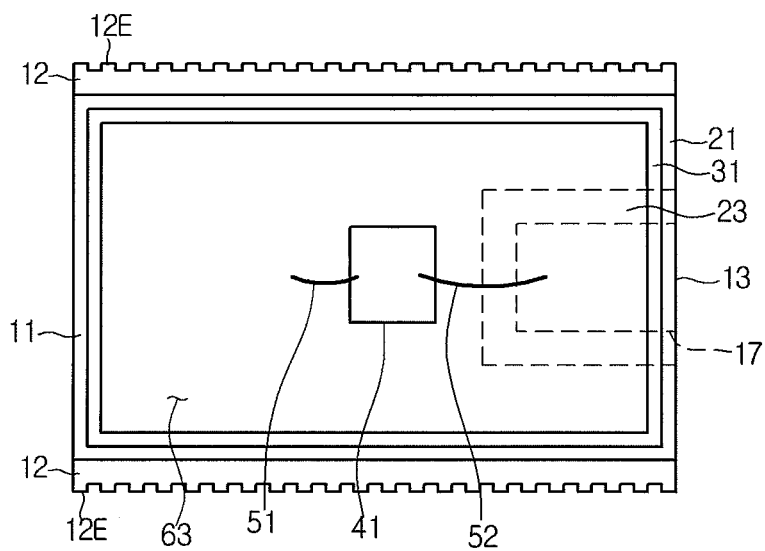

FIGS. 57 to 59 are views illustrating modified examples of a metal layer of a light emitting device according to an embodiment.

Referring to FIG. 57, one surface of top, lower, and side surfaces of the metal layers 11 and 13 may have one or more uneven structures 11E and 13E including a convex portion and a concave portion. The uneven structures 11E and 13E may be disposed under a first insulation film 21 and may extend up to opened areas A1 and A2 of each of the metal layers 11 and 13.

Also, the uneven structures 11E and 13E may be disposed on surface of the metal layers 11 and 13 except an area on which the light emitting chip 41 is disposed or an area to which the wires 51 and 52 are bonded, thereby improving contact characteristics of the metal layers 11 and 13, the light emitting chip 41, and the wires 51 and 52.

Each of the uneven structures 11E and 13E may have one of a triangular shape, a square shape, a trapezoid shape, and a sin-curve shape, but is not limited thereto.

The uneven structures 11E and 13E may improve a contact area between the insulation films 21 and 23 on the metal layers 11 and 13 or heat radiation efficiency.

Referring to FIG. 58, lower surfaces of the plurality of metal layers 11 and 13 may have the uneven structures 11E and 13E. Protrusion parts of the uneven structures 11E and 13E may have a stripe shape or matrix shape, but is not limited thereto.

Referring to FIG. 59, a heatsink frame 12 may be disposed on one side surface of one metal layer 11 of the plurality of metal layers. The heatsink frame 12 may be formed of the same material as the metal layer 11 or a material having conductivity superior than that of the metal layer 11. The heatsink frame 12 may have a surface having one or more uneven structures 12E including a concave portion and a convex portion.

Each of the uneven structures 11E and 13E may have one of a triangular shape, a square shape, a trapezoid shape, and a sin-curve shape, but is not limited thereto.

The thermal efficiency of the metal layers 11 and 13 may be improved through the uneven structures 12E of the heatsink frame 12.

As another example, the uneven structures may be provided on side surfaces of the plurality of metal layers 11 and 13 to increase surface areas, thereby improving thermal efficiency.

<Light Emitting Chip>

A light emitting chip according to an embodiment will be described with reference to FIGS. 60 and 61.

Figure 60:
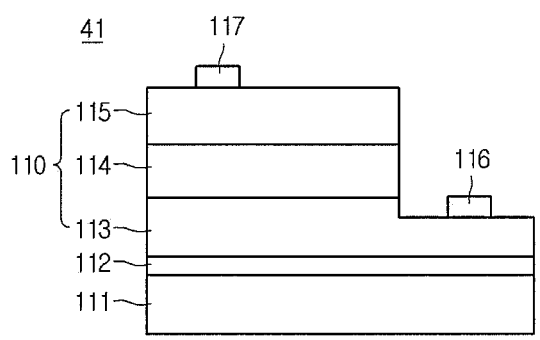
FIGS. 60 and 61 are views illustrating an example of a light emitting chip according to an embodiment.

Referring to FIG. 60, a light emitting chip 41 may include a substrate 111, a buffer layer 112, a first conductive type semiconductor layer 113, an active layer 114, a second conductive type semiconductor layer 115, a first electrode 116, and a second electrode 117. The first conductive type semiconductor layer 113, the active layer 114, and the second conductive type semiconductor layer 115 may be defined as a light emitting structure.

The substrate 111 may be formed of $Al_2O_3$, GaN, SiC, ZnO, Si, GaP, InP, $Ga_2O_3$, a conductive substrate, and GaAs. The substrate 111 may be a growth substrate. A semiconductor having the compositional formula of $In_xAl_yGa_{1-x-y}N$ ($0 \leq x \leq 1$, $0 \leq y \leq 1$, $0 \leq x+y \leq 1$) may be grown on the growth substrate.

The buffer layer 112 may a layer for reducing a lattice constant difference between the substrate 111 and the semiconductor and may be formed of a group II to VI compound semiconductor. An undoped Group III-V compound semiconductor layer may be further disposed on the buffer layer 112, but is not limited thereto.

The first conductive type semiconductor layer 113 is disposed on the buffer layer 112, the active layer 124 is disposed on the first conductive type semiconductor layer 113, and the second conductive layer 115 is disposed on the active layer 124.

The first conductive type semiconductor layer 113 may be formed of a group III-V compound semiconductor in which a first conductive type dopant is doped, e.g., one of GaN, AlN, AlGaN, InGaN, InN, InAlGaN, AlInN, AlGaAs, GaP, GaAs, GaAsP, and AlGaInP When the first conductive type semiconductor layer is an N-type semiconductor layer, the first conductive type dopant may include an N-type dopant such as Si, Ge, Sn, Se, and Te. The second conductive type semiconductor layer 114 may be formed as a single layer or a multi layer, but is not limited thereto.

The active layer 114 may have one of a single quantum well structure, a multi quantum well (MQW) structure, a quantum wire structure, and a quantum dot structure. The active layer 114 may have a cycle of a well layer and a barrier layer, e.g., an InGaN well layer/GaN barrier layer or a cycle of an InGaN well layer/AlGaN barrier layer using the group III-V compound semiconductor material.

A conductive type clad layer may be disposed above or/and under the active layer 114. The conductive type clad layer may be formed of an AlGaN-based semiconductor.

A second conductive type is formed on the active layer 114. The second conductive semiconductor layer 115 may be formed of a group III-V compound semiconductor in which a second conductive type dopant is doped, e.g., one of GaN, MN, AlGaN, InGaN, InN, InAlGaN, AlInN, AlGaAs, GaP, GaAs, GaAsP, and AlGaInP. When the second conductive type semiconductor layer is a P-type semiconductor layer, the second conductive type dopant may include a P-type dopant such as Mg and Ze. The second conductive type semiconductor layer 115 may have a single or multi-layered structure, but is not limited thereto.

A third conductive type semiconductor layer, e.g., an N-type semiconductor layer may be disposed on the second conductive type semiconductor layer 115. Thus, the light emitting structure 135 may have at least one of an N—P junction structure, a P—N junction structure, an N—P—N junction structure, and a P—N—P junction structure.

A current spreading layer may be disposed on the second conductive type semiconductor layer 115. The current spreading layer may be formed of one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO).

A first electrode 116 may be disposed on the first conductive type semiconductor layer 113 and a second electrode 117 may be disposed on the second conductive type semiconductor layer 115.

The first electrode 116 and the second electrode 117 may be connected to the metal layers of FIG. 1 or 5 through a wire.

Figure 61:
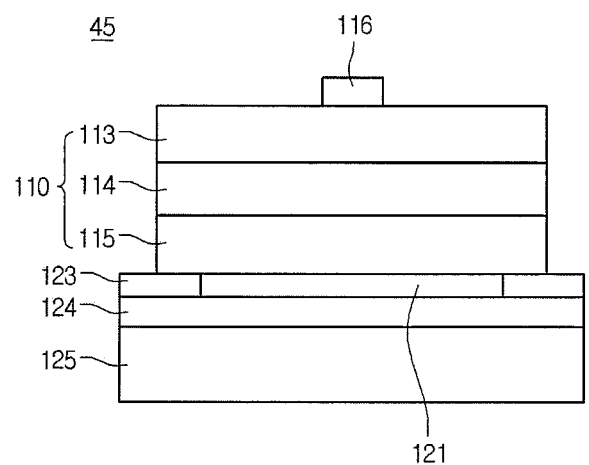

FIG. 61 is a view of a vertical type chip structure.

Referring to FIG. 61, in a light emitting chip 45, an ohmic layer 121 is disposed under a light emitting structure 110, a reflective layer 124 is disposed under the ohmic layer 121, a conductive supporting member 125 is disposed under the reflective layer 124, and a protective layer 123 is disposed around the reflective layer 124 and the light emitting structure 110.

The light emitting device 45 may be formed by forming an ohmic layer 121, a channel layer 123, a reflective layer 124, and a conductive supporting member 125 on the second conductive type semiconductor layer 115 and then removing the substrate 111 and the buffer layer 112 without performing an etching process for exposing the first conductive type semiconductor layer 113 in the structure of FIG. 52.

The ohmic layer 121 may ohmic-contact a lower layer of the light emitting structure 110, for example, the second conductive type semiconductor layer. The ohmic layer 121 may be formed of one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au, Hf and combinations thereof. Also, the ohmic layer 121 may be formed as a multi layer using the metal material and a light-transmitting conductive material such as IZO, IZTO, IAZO, IGZO, IGTO, AZO, and ATO. For example, the multi layer may include IZO/Ni, AZO/Ag, IZO/Ag/Ni, and AZO/Ag/Ni. A layer for blocking current corresponding to the electrode 16 may be further disposed within the ohmic layer 121.

The protective layer 123 may be formed of one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $SiO_x$, $SiO_xN_y$, $Si_3N_4$, $Al_2O_3$, and $TiO_2$. The protective layer 123 may be formed through a sputtering method or a deposition method. The protective layer 123 may prevent the layers of the light emitting structure 110 from being electrically short-circuited with each other.

The reflective layer 124 may be formed of one of Ag, Ni, Al, Rh, Pd, Ir, Ru, Mg, Zn, Pt, Au, Hf, and combinations thereof. The reflective layer 124 may have a width wider than that of the light emitting structure 110 to improve light reflection efficiency.

For example, the conductive support member 125 may serve as a base substrate. The conductive support member 125 may be formed of at least one of copper (Cu), gold (Au), nickel (Ni), molybdenum (Mo), copper-tungsten (Cu—W), and carrier wafers (e.g., Si, Ge, GaAs, ZnO, Sic, etc). An adhesion layer may be further disposed between the conductive support member 125 and the reflective layer 124. Thus, the two layers may adhere to each other by the adhesion layer.

The above-disclosed light emitting chip is just one example and is not limited to the above features. The light emitting chip may be selectively applied to the embodiments of the light emitting device, but is not limited thereto.

<Lighting System>

The light emitting device of the above disclosed embodiments has a structure in which the light emitting chip is packaged. Also, a plurality of light emitting devices may be disposed on a board, and thus provided to a lighting system such as a light emitting module or a light unit. One of the light emitting devices according to the above embodiments may be applied to the lighting system.

The light emitting device according to the embodiment may be applied to the light unit. The light unit may have a structure in which a plurality of light emitting devices are arrayed. The light unit may include the display device illustrated in FIGS. 62 and 63 and the lighting device illustrated in FIG. 64. Furthermore, the light unit may include illumination lamps, traffic lights, vehicle headlights, and signs.

Figure 62:
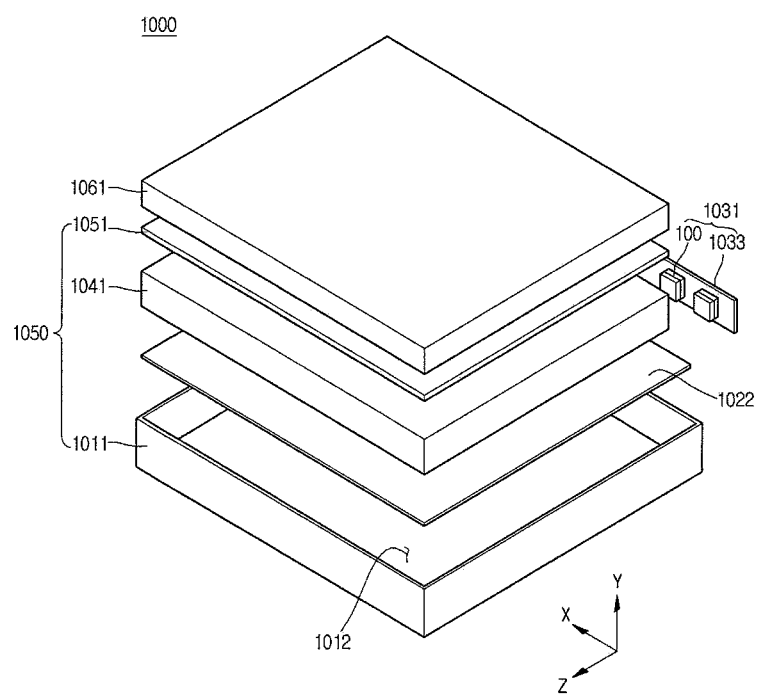
FIG. 62 is a perspective view illustrating an example of a display device according to an embodiment.

FIG. 62 is an exploded perspective view illustrating a display device according to an embodiment.

Referring to FIG. 62, a display unit 1000 may include a light guide plate 1041, a light emitting module 1031 providing light to the light guide plate 1041, a reflective member 1022 under the light guide plate 1041, an optical sheet 1051 above the light guide plate 1041, a display panel 1061 above the optical sheet 1051, and a bottom cover 1011 receiving the light guide plate 1031, the light emitting module 1031, and the reflective member 1022, but is not limited thereto.

The bottom cover 1011, the reflective member 1022, the light guide plate 1041, and the optical sheet 1051 may be defined as the light unit 1050.

The light guide plate 1041 diffuses light to produce planar light. For example, the light guide plate 1041 may be formed of a transparent material, e.g., one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 is disposed to provide light to the at least one lateral surface of the light guide plate 1041. Thus, the light emitting module 1031 may be used as a light source of a display device.

At least one light emitting module 1031 may be disposed on one lateral surface of the light guide plate 1041 to directly or indirectly provide light. The light emitting module 1031 may include a board 1033 and the light emitting devices 100 according to the embodiment. Also, the light emitting devices 100 may be arrayed on the board 1033 with a predetermined interval.

The board 1033 may be a printed circuit board (PCB) including a circuit pattern. The board 1033 may include a metal core PCB (MCPCB) or a flexible PCB (FPCB) as well as a general PCB, but is not limited thereto. When the light emitting device 100 are mounted on a lateral surface of the bottom cover 1011 or on a heatsink plate, the substrate 1033 may be removed. Here, a portion of the heatsink plate may contact a top surface of the bottom cover 1011.

The plurality of light emitting devices 100 may be mounted on the substrate 1033 to allow a light emission surface through which light is emitted to be spaced a predetermined interval from the light guide plate 1041, but is not limited thereto. The light emitting device 100 may directly or indirectly provide light to a light incident surface that is a side surface of the light guide plate 1041, but is not limited thereto.

The reflective member 1022 may be disposed below the light guide plate 1041. Since the reflective member 1022 reflects light incident onto an lower surface of the light guide plate 1041 to supply the light upward, brightness of the light unit 1050 may be improved. For example, the reflective member 1022 may be formed of one of PET, PC, and PVC, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may include a receiving part 1012 having a box shape with an opened upper side, but is not limited thereto. The bottom cover 1011 may be coupled to a top cover (not shown), but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel, and include first and second boards formed of a transparent material and a liquid crystal layer between the first and second boards. A polarizing plate may be attached to at least one surface of the display panel 1061. The present disclosure is not limited to the attached structure of the polarizing plate. The display panel 1061 may display information using light emitted from the light emitting module 1051. The display unit 1000 may be applied to various portable terminals, a monitor for a notebook computer, a monitor for a laptop computer, television, etc.

The optical sheet 1051 is disposed between the display panel 1061 and the light guide plate 1041 and includes at least one transmission sheet. For example, the optical sheet 1051 may include at least one of a diffusion sheet, a horizontal or vertical prism sheet, a brightness enhanced sheet, etc. The diffusion sheet diffuses incident light, and the horizontal or/and vertical prism sheet collects the incident light into a display region. In addition, the brightness enhanced sheet reuses lost light to improve the brightness. Also, a protective sheet may be disposed on the display panel 1061, but is not limited thereto.

Here, optical members such as the light guide plate 1041 and the optical sheet 1051 may be disposed on an optical path of the light emitting module 1031, but is not limited thereto.

Figure 63:
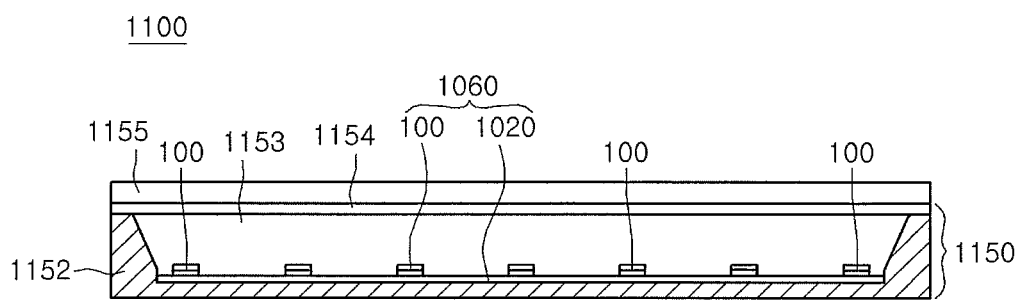
FIG. 63 is a perspective view illustrating another example of the display device according to an embodiment.

FIG. 63 is a view of a display device according to an embodiment.

Referring to FIG. 63, a display apparatus 1100 includes a bottom cover 1152, a board 1120 on which the light emitting devices 100 described above are arrayed, an optical member 1154, and a display panel 1155.

The substrate 1120 and the light emitting device 100 may be defined as a light emitting module 1060. The bottom cover 1152, at least one light emitting module 1060, the optical member 1154 may be defined as the light unit.

The bottom cover 1152 may include a receiving part 1153, but is not limited thereto.

Here, the optical member 1154 may include at least one of a lens, a light guide plate, a diffusion sheet, horizontal and vertical prism sheets, and a bright enhancement sheet. The light guide plate may be formed of a PC material or PMMA material. In this case, the light guide plate may be removed. The diffusion sheet diffuses incident light, and the horizontal and vertical prism sheets collect the incident light into the display panel 1155. The brightness enhanced sheet reuses lost light to improve brightness.

The optical member 1154 is disposed on the light emitting module 1060 to produce planar light using the light emitted from the light emitting module 1060 or diffuse and collect the light emitted from the light emitting module 1060.

Figure 64:
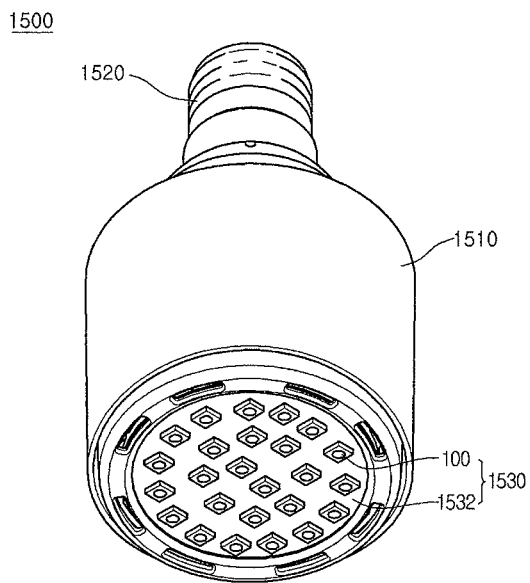
FIG. 64 is a view of a lighting unit according to an embodiment.

FIG. 64 is a perspective view of a lighting device according to an embodiment.

Referring to FIG. 64, the lighting unit 1500 may include a case 1510, a light emitting module 1530 disposed in the case 1510, and a connection terminal 1520 disposed in the case 1510 to receive an electric power from an external power source.

The case body 1510 may be formed of a material having good thermal dissipation properties, e.g., a metal material or a resin material.

The light emitting module 1530 may include a board 1532 and a light emitting device 100 mounted on the board 1532. The light emitting device 100 may be provided in plurality, and the plurality of light emitting devices 200 may be arrayed in a matrix shape or spaced a predetermined interval from each other.

A circuit pattern may be printed on a dielectric to manufacture the board 1532. For example, the board 1532 may include a printed circuit board (PCB), a metal core PCB, a flexible PCB, a ceramic PCB, or a FR-4.

Also, the board 1532 may be formed of a material which may effectively reflect light or be coated with a color by which light is effectively reflected, e.g., a white color or a silver color.

At least one light emitting device 100 may be disposed on the board 1532. The light emitting device 100 may include at least one light emitting diode (LED) chip. The LED may include color LEDs, which respectively emit light having a red color, a green color, a blue color, and a white color and an ultraviolet (UV) LED emitting UV rays.

The light emitting module 1530 may have combinations of several light emitting devices 100 to obtain desired color and luminance. For example, the white LED, the red LED, and the green LED may be combined with each other to secure a high color rendering index.

The connection terminal 1520 may be electrically connected to the light emitting module 1530 to supply a power. The connection terminal 1520 may be screwed and coupled to an external power source in a socket type, but is not limited thereto. For example, the connection terminal 1520 may have a pin shape, and thus, be inserted into the external power source. Alternatively, the connection terminal 1220 may be connected to the external power source by a wire.

According to the embodiments the tape-type or film-type light emitting device may be provided to support the metal layer through the insulation film without using the package body.

According to the embodiments the manufacturing process of the light emitting device may be improved. Furthermore, the light emitting device may be reduced in thickness. According to the embodiments the light extraction efficiency of the light emitting device may be improved.

According to the embodiments the reliability of the light emitting device may be improved. Also, the miniaturization and integration of the light emitting device may be improved. According to the embodiments, the thermal efficiency may be improved in the light emitting device and a lighting system having the same.

Features, structures, and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure.

Although embodiments have been described with reference to illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

What is claimed is:

1. A light emitting device comprising:
a plurality of metal layers spaced from each other by a separation part;
a first insulation film having an opened area in which an inner portion of top surfaces of the plurality of metal layers is opened, the first insulation film being disposed around the top surfaces of the plurality of metal layers;
a light emitting chip disposed on a top surface of at least one of the plurality of metal layers, the light emitting chip being electrically connected to the plurality of metal layers;
a second insulation film corresponding between the plurality of metal layers and having a width wider than an interval between the plurality of metal layers on the top surfaces of the plurality of metal layers;
a first adhesion layer disposed between the first insulation film and the plurality of metal layers;
a second adhesion layer disposed between the second insulation film and the plurality of metal layers;
a resin layer disposed on the top surfaces of the plurality of metal layers and the light emitting chip; and
a first guide member disposed on a top surface of the first insulation film,
wherein the resin layer is disposed on the opened area of the first insulation film,
wherein the top surface of the first insulation film has a width wider than that of a bottom surface of the first guide member,
wherein a portion of the resin layer is physically contacted with the top surface of the first insulation film,
wherein a top surface of the first guide member is located higher than that of the light emitting chip,
wherein the first guide member is disposed around the resin layer,
wherein an entire region of the first guide member is located higher than those of the plurality of metal layers,
wherein an outer portion of the first insulation film is not overlapped with the first guide member in a vertical direction and is extended outwardly from an outer sidewall of the first guide member, wherein the second adhesion layer physically contacts the resin layer and the second insulation film, wherein the first insulation film has a thickness thicker than that of each of the plurality of metal layers, wherein the second adhesion layer includes an opening region on the separation part between the plurality of metal layers, and wherein the opening region of the second adhesion layer is disposed between the second insulation film and the separation part.

2. The light emitting device according to claim 1, wherein the first guide member is formed of a non-metallic material.

3. The light emitting device according to claim 1, wherein the second insulation film is extended from the first insulation film.

4. The light emitting device according to claim 1, wherein an outer side wall of the first insulation film is located outer than an outer side wall of the first guide member.

5. The light emitting device according to claim 1, further comprising a lens disposed on a top surface of the resin layer and the top surface of the first guide member.

6. The light emitting device according to claim 1, further comprising a phosphor layer disposed on a top surface of the resin layer.

7. The light emitting device according to claim 1, wherein the plurality of metal layers comprise first and second metal layers spaced from each other, and the light emitting chip is disposed on a top surface of the first metal layer and is connected to the second metal layer through a wire, and wherein the second adhesion layer is disposed on the top surface of the first metal layer and a top surface of the second metal layer.

8. The light emitting device according to claim 7, wherein the top surface of the first metal layer has an area larger than that of the second metal layer.

9. The light emitting device according to claim 1, wherein the first insulation film comprises at least one selected from the group consisting of a polyimide (PI) film, a polyethylene terephthalate (PET) film, an ethylene vinyl acetate (EVA) film, a polyethylene naphthalate (PEN) film, a triacetyl cellulose (TAC) film, a polyamide imide (PAI) film, a polyether ether ketone (PEEK) film, a perfluoroalkoxy (PFA) film, a polyphenylene sulfide (PPS) film, and a resin film.

10. The light emitting device according to claim 1, further comprising a second guide member disposed between the second insulation film and the resin layer and formed of a non-metallic material.

11. A light emitting device comprising:
a first and a second metal layers spaced from each other by a separation part;
a light emitting chip disposed on a top surface of the first metal layer;
an insulation layer disposed on top surfaces of the first and second metal layers and disposed around the light emitting chip;
a reflection member disposed on a top surface of the insulation layer;
a first wire connected to the light emitting chip and the second metal layer;
a transparent resin layer contacted physically with the top surfaces of the first and second metal layers and the top surface of the insulation layer; and
an adhesion layer disposed between the insulation layer and the first and second metal layers, wherein the insulation layer includes a first open area on the top surface of the first metal layer and a second open area on the top surface of the second metal layer, wherein the light emitting chip is disposed in the first open area, wherein the first wire connected to the second metal layer is disposed in the second open area, wherein a first portion of the insulation layer is corresponded between the first and second metal layers and has a width wider than an interval between the first and second metal layers on the top surfaces of the first and second metal layers, wherein a top surface of the reflection member is located higher than that of the light emitting chip, wherein the reflection member is disposed around the transparent resin layer, wherein an entire region of the reflection member is located higher than those of the first and second metal layers, wherein an outer portion of the insulation layer is not overlapped with the reflection member in a vertical direction and is extended outwardly from an outer sidewall of the reflection member, wherein the adhesion layer includes a first region disposed between the first portion of the insulation layer and the first metal layer and a second region disposed between the first portion of the insulation layer and the second metal layer, wherein the insulation layer has a thickness thicker than that of each of the first and second metal layers, wherein the adhesion layer includes an opening region on the separation part between the first metal layer and the second metal layer, and wherein the opening region of the adhesion layer is disposed between the first portion of the insulation layer and the separation part.

12. The light emitting device according to claim 11, wherein the insulation layer includes a third open area disposed on the top surface of the first metal layer.

13. The light emitting device according to claim 12, further comprising a second wire connected to the light emitting chip and the first metal layer and disposed in the third open area.

14. The light emitting device according to claim 12, wherein the insulation layer includes a second portion between the first open area and the third open area.

15. The light emitting device according to claim 11, wherein the reflection member includes a non-metallic material.

16. The light emitting device according to claim 15, wherein a portion of the reflection member is disposed on the first portion of the insulation layer, and wherein the portion of the reflection member is disposed between the transparent resin layer and the first portion of the insulation layer.

17. The light emitting device according to claim 11, wherein an entire lower surface of the insulation layer is located higher than the top surfaces of the first and second metal layers.

18. The light emitting device according to claim 11, wherein the first and second regions of the adhesion layer contact the transparent resin layer.

19. A light emitting device comprising:
a first metal layer and a second metal layer spaced from each other;
a first insulation film having an opened area in which an inner portion of top surfaces of the first and second metal layers is opened, the first insulation film being disposed around the top surfaces of the first and second metal layers;

a light emitting chip disposed on a top surface of the first metal layer, the light emitting chip being electrically connected to the first and second metal layers;

a second insulation film corresponding between the first and second metal layers;

a resin layer disposed on the first and second of metal layers and the light emitting chip;

a first guide member disposed on a top surface of the first insulation film and formed of a non-metallic material; and a second guide member disposed on a top surface of the second insulation film and formed of a non-metallic material, wherein the resin layer is disposed on the first and second guide members, wherein a first portion of the first guide member contacts the first and second metal layers, and wherein a first portion of the second guide member contacts the first metal layer and is disposed closer to the light emitting chip than the second insulation film.

20. The light emitting device according to claim 19, wherein the first portion of the first guide member contacts an inner side of the first insulation film.

* * * * *